(12) United States Patent
Kim et al.

(10) Patent No.: US 8,592,281 B2
(45) Date of Patent: Nov. 26, 2013

(54) METHOD OF FORMING POLYSILICON RESISTOR DURING REPLACEMENT METAL GATE PROCESS AND SEMICONDUCTOR DEVICE HAVING SAME

(75) Inventors: Ju Youn Kim, Suwon-si (KR); Jedon Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 164 days.

(21) Appl. No.: 13/182,594

(22) Filed: Jul. 14, 2011

(65) Prior Publication Data

US 2013/0015531 A1 Jan. 17, 2013

(51) Int. Cl.
*H01L 21/20* (2006.01)
(52) U.S. Cl.
USPC ..................... 438/382; 257/E21.09
(58) Field of Classification Search
USPC ..................... 438/382; 257/E21.35
See application file for complete search history.

(56) References Cited

U.S. PATENT DOCUMENTS

| 7,949,821 | B2 * | 5/2011 | Han | 711/103 |
| 2011/0140185 | A1 * | 6/2011 | Nishimura et al. | 257/296 |
| 2011/0171810 | A1 * | 7/2011 | Tseng et al. | 438/382 |
| 2011/0318897 | A1 * | 12/2011 | Shang et al. | 438/382 |
| 2013/0015530 | A1 * | 1/2013 | Kim et al. | 257/380 |
| 2013/0015532 | A1 * | 1/2013 | Kim et al. | 257/380 |

* cited by examiner

*Primary Examiner* — William D Coleman
(74) *Attorney, Agent, or Firm* — F. Chau & Associates, LLC

(57) ABSTRACT

A method for manufacturing a semiconductor device, comprising forming a first gate stack portion on a surface of a substrate, the first gate stack portion including a first gate oxide layer and a first polysilicon layer on the first gate oxide layer, forming a second gate stack portion on the surface of the substrate, the second gate stack portion including a second gate oxide layer and a second polysilicon layer on the second gate oxide layer, forming a resistor portion in a recessed portion of the substrate below the surface of the substrate, the resistor portion including a third polysilicon layer, and removing the first and second polysilicon layers from the first and second gate stack portions to expose the first and second gate oxide layers, wherein at least one of a dielectric layer and a stress liner cover a top surface of the resistor portion during removal of the first and second polysilicon layers.

25 Claims, 25 Drawing Sheets

METHOD OF FORMING POLYSILICON RESISTOR DURING REPLACEMENT METAL GATE PROCESS AND SEMICONDUCTOR DEVICE HAVING SAME

BACKGROUND

1. Technical Field

The present disclosure relates to method of forming a polysilicon resistor during a replacement metal gate process, and a semiconductor device having the polysilicon resistor.

2. Discussion of the Related Art

Metal-oxide-semiconductor (MOS) transistors using polysilicon gate electrodes are known. Polysilicon material is able to tolerate high temperature processing better than most metals, so that polysilicon can be annealed at high temperatures along with source and drain regions. In addition, polysilicon blocks ion implantation of doped atoms into a channel region, facilitating the formation of self-aligned source and drain structures after gate patterning is completed.

The high resistivities of polysilicon materials, as compared to most metal materials result in polysilicon gate electrodes that operate at much slower speeds than gates made of metallic materials. One way of compensating for the higher resistance of polysilicon materials is to perform extensive silicide processing on the polysilicon materials so that the speed of operation of the polysilicon materials is increased to acceptable levels.

Another way of compensating for the higher resistance polysilicon materials is to replace a polysilicon gate device with a metal gate device. This replacement can be done with a replacement metal gate (RMG) process, wherein the higher temperature processing is performed while the polysilicon is present in the substrate, and after such processing, the polysilicon is removed and replaced with metal to form the replacement metal gate. More specifically, a device with a disposable polysilicon gate is processed, and the disposable gate and dielectrics are etched away, exposing an original gate oxide. The disposable polysilicon gate is then replaced by a metal gate having lower resistivity than the polysilicon material.

In known RMG processes, polysilicon is also removed from the areas forming resistors on the substrate, and replaced with metallic materials. As a result, the high resistive properties of polysilicon are not utilized for resistors on a substrate in which RMG processing has been performed.

Accordingly, there exists a need for a process in which polysilicon remains in the portions of a substrate forming the resistors so that polysilicon resistors can be formed even though an RMG process has been performed on the substrate.

SUMMARY

A method for manufacturing a semiconductor device, according to an embodiment of the inventive concept, comprises forming a first gate stack portion on a surface of a substrate, the first gate stack portion including a first gate oxide layer and a first polysilicon layer on the first gate oxide layer, forming a second gate stack portion on the surface of the substrate, the second gate stack portion including a second gate oxide layer and a second polysilicon layer on the second gate oxide layer, forming a resistor portion in a recessed portion of the substrate below the surface of the substrate, the resistor portion including a third polysilicon layer, and removing the first and second polysilicon layers from the first and second gate stack portions to expose the first and second gate oxide layers, wherein at least one of a dielectric layer and a stress liner cover a top surface of the resistor portion during removal of the first and second polysilicon layers.

Removing the first and second polysilicon layers may comprise etching using at least one of ammonia, tetramethyl ammonium hydroxide (TMAH), and tetraethylammonium hydroxide (TEAH), and may be performed in a single step.

The recessed portion may be formed by etching a portion of an isolation region formed below the surface of the substrate, and may have a depth of about 100 angstroms to 400 angstroms below the surface of the substrate.

The method may further comprise depositing a high-K dielectric material on exposed portions of the substrate, including the first and second gate oxide layers, and depositing a first metal on the high-K dielectric layer. The first metal may comprise a three-layer structure of a bottom layer of TiN, a middle layer of TaN and a top layer of TiN.

The method may further comprise forming a photoresist covering the second gate stack portion and the resistor portion, removing the top layer of TiN from the first gate stack portion, removing the photoresist, and depositing a second metal on exposed portions of the substrate, including the first and second gate stack portions, wherein the second metal comprises a three-layer structure of a bottom layer of TiAl, a middle layer of TiN, and a top layer of titanium and aluminum alloy (Ti/Al).

The method may further comprise performing a chemical mechanical polishing to remove the high-K dielectric material, the first metal and the second metal from a top surface of the semiconductor device, and to planarize the top surface of the semiconductor device.

The method may further comprise depositing, prior to removing the first and second polysilicon layers from the first and second gate stack portions, the at least one of the dielectric layer and the stress liner on the substrate adjacent and between the first and second gate stack portions and the resistor portion, and over the resistor portion, and performing a chemical mechanical polishing to remove part of the at least one of the dielectric layer and the stress liner to planarize a top surface of the semiconductor device to be level with a top of the first and second gate stack portions, leaving the at least one of a dielectric layer and a stress liner covering the top surface of the resistor portion.

The method may further comprise depositing a high-K dielectric material on exposed portions of the substrate, including the first and second gate oxide layers, depositing a metal on the high-K dielectric layer, performing a chemical mechanical polishing to remove the high-K dielectric material, and the metal from a top surface of the semiconductor device, and to planarize the top surface of the semiconductor device, and removing the at least one of the dielectric layer and the stress liner from the substrate except for a portion of the at least one of the dielectric layer and the stress liner in the recessed portion.

A semiconductor device, according to an embodiment of the inventive concept, comprises a substrate, a first gate stack portion on a surface of the substrate, the first gate stack portion including a first gate oxide layer and a first metal layer on the first gate oxide layer, a second gate stack portion on the surface of the substrate, the second gate stack portion including a second gate oxide layer and a second metal layer on the second gate oxide layer, and a resistor portion positioned in a recessed portion below the surface of the substrate, the resistor portion including a polysilicon layer, wherein a top surface of the resistor portion is positioned below top surfaces of the first and second gate stack portions.

The recessed portion may be formed in a portion of an isolation region formed below the surface of the substrate, and may have a depth of about 100 angstroms to 400 angstroms below the surface of the substrate.

A computer system, according to an embodiment of the inventive concept, comprises the semiconductor device, wherein the computer system is one of a personal computer (PC), a personal digital assistant (PDA), an MP3 player, a digital audio recorder, a pen-shaped computer, a digital camera, or a video recorder.

A method for manufacturing a semiconductor device, according to an embodiment of the inventive concept, comprises forming a plurality of isolation regions in a substrate, depositing a gate oxide layer on a surface of the substrate including the plurality of isolation regions, depositing a first polysilicon layer on the gate oxide layer, forming a photoresist on part of the polysilicon layer, wherein a portion of the polysilicon layer over an isolation region remains exposed, removing the exposed portion of the polysilicon layer, and portions of the gate oxide layer and the isolation region under the exposed portion of the polysilicon layer to form a recessed portion below the surface of the substrate, removing the photoresist, depositing a second polysilicon layer in the recessed portion and on the substrate including the first polysilicon layer, and doping a portion of the second polysilicon layer formed in the recessed portion.

The portion of the second polysilicon layer in the recessed portion may be doped with boron, and forms a resistor of the semiconductor device. The recessed portion may have a depth of about 100 angstroms to 400 angstroms below the surface of the substrate.

A system for transmitting or receiving data, according to an embodiment of the inventive concept, comprises a memory device for storing a program, and a processor in communication with the memory device, wherein the memory device comprises a substrate, a first gate stack portion on a surface of the substrate, the first gate stack portion including a first gate oxide layer and a first metal layer on the first gate oxide layer, a second gate stack portion on the surface of the substrate, the second gate stack portion including a second gate oxide layer and a second metal layer on the second gate oxide layer, and a resistor portion positioned in a recessed portion below the surface of the substrate, the resistor portion including a polysilicon layer, wherein a top surface of the resistor portion is positioned below top surfaces of the first and second gate stack portions.

A semiconductor memory card, according to an embodiment of the present inventive concept, comprises an interface part that interfaces with an external device, a controller that communicates with the interface part and a memory device via address and data buses, wherein the memory device comprises a substrate, a first gate stack portion on a surface of the substrate, the first gate stack portion including a first gate oxide layer and a first metal layer on the first gate oxide layer, a second gate stack portion on the surface of the substrate, the second gate stack portion including a second gate oxide layer and a second metal layer on the second gate oxide layer, and a resistor portion positioned in a recessed portion below the surface of the substrate, the resistor portion including a polysilicon layer, wherein a top surface of the resistor portion is positioned below top surfaces of the first and second gate stack portions.

A computer system, according to an embodiment of the inventive concept, comprises a semiconductor device having a circuit layout manufactured by any of the above methods, wherein the computer system is one of a personal computer (PC), a personal digital assistant (PDA), an MP3 player, a digital audio recorder, a pen-shaped computer, a digital camera, or a video recorder.

A system for transmitting or receiving data, according to an embodiment of the inventive concept, comprises a memory device for storing a program, and a processor in communication with the memory device, wherein the memory device comprises a circuit layout manufactured by any of the above methods. The system may comprise at least one of a mobile system, a portable computer, a web tablet, a mobile phone, a digital music player, or a memory card.

A semiconductor memory card, according to an embodiment of the present inventive concept, comprises an interface part that interfaces with an external device, a controller that communicates with the interface part and a memory device via address and data buses, wherein the memory device comprises a circuit layout manufactured by any of the above methods.

BRIEF DESCRIPTION OF THE DRAWINGS

Exemplary embodiments of the present inventive concept will be described below in more detail, with reference to the accompanying drawings, of which.

DETAILED DESCRIPTION OF THE EMBODIMENTS

Exemplary embodiments of the present inventive concept now will be described more fully hereinafter with reference to the accompanying drawings. This inventive concept may, however, be embodied in many different forms and should not be construed as limited to the embodiments set forth herein.

Figure 1:
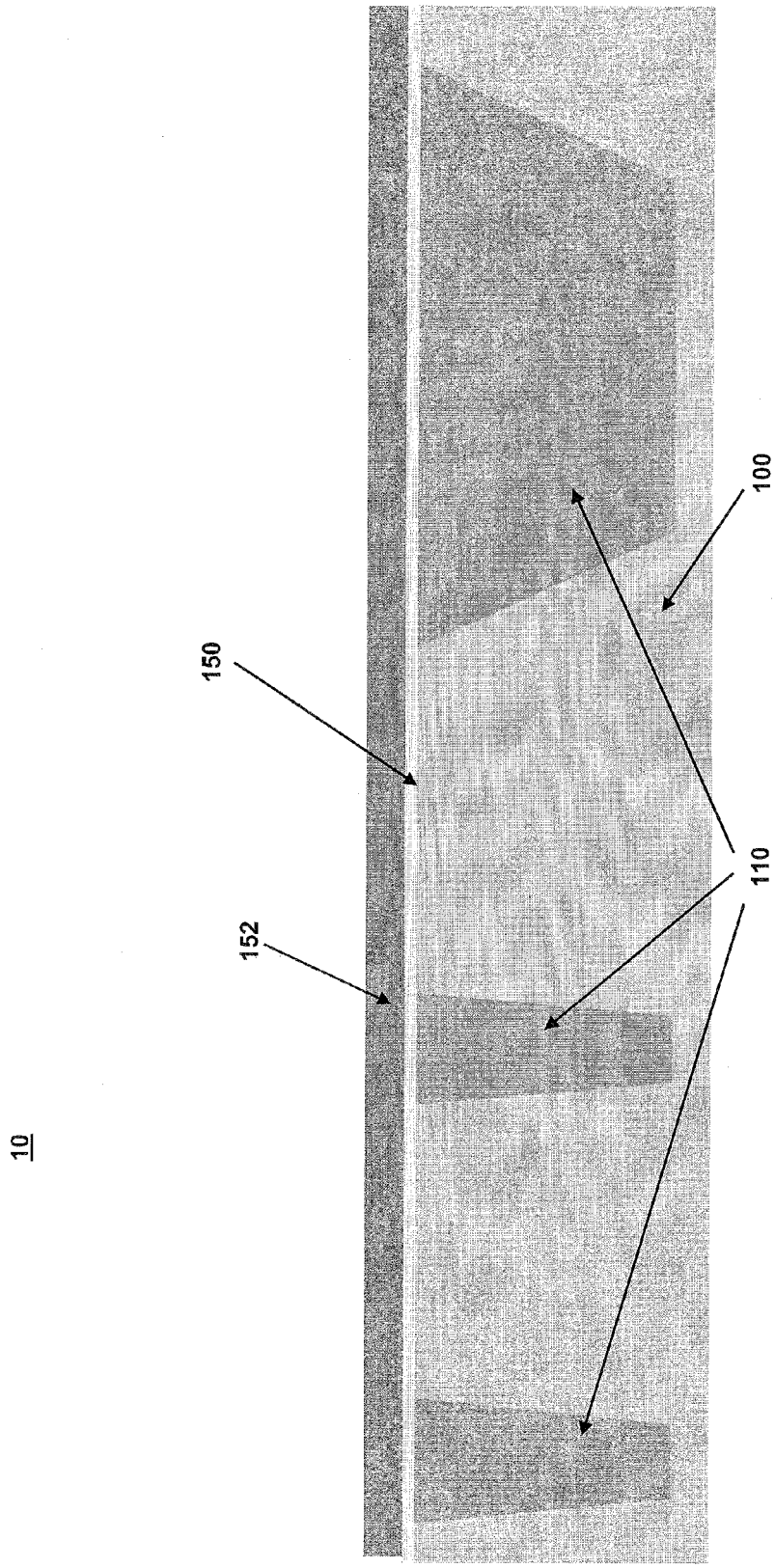
FIGS. 1-22 are cross-sectional views of a semiconductor substrate for illustrating a replacement metal gate process, and a resulting semiconductor device, according to embodiments of the present inventive concept.

Referring to FIG. 1, according to an embodiment of the present inventive concept, a semiconductor device 10 includes a substrate 100 including a plurality of shallow trench isolation (STI) regions 110. On the substrate, a first single gate (SG) field-effect transistor (FET) will be formed between first and second STI regions 110 (looking from left to right in FIG. 1), a second SG FET will be formed between second a third STI regions 110, and a resistor structure will be formed over the third STI region 110. As shown in FIG. 1 a gate oxide layer 150 is deposited on the substrate 100 and a polysilicon layer 152 is formed on the gate oxide layer 150. According to an embodiment, the polysilicon layer 152 may be approximately 100 angstroms to approximately 600 angstroms thick.

Figure 2:
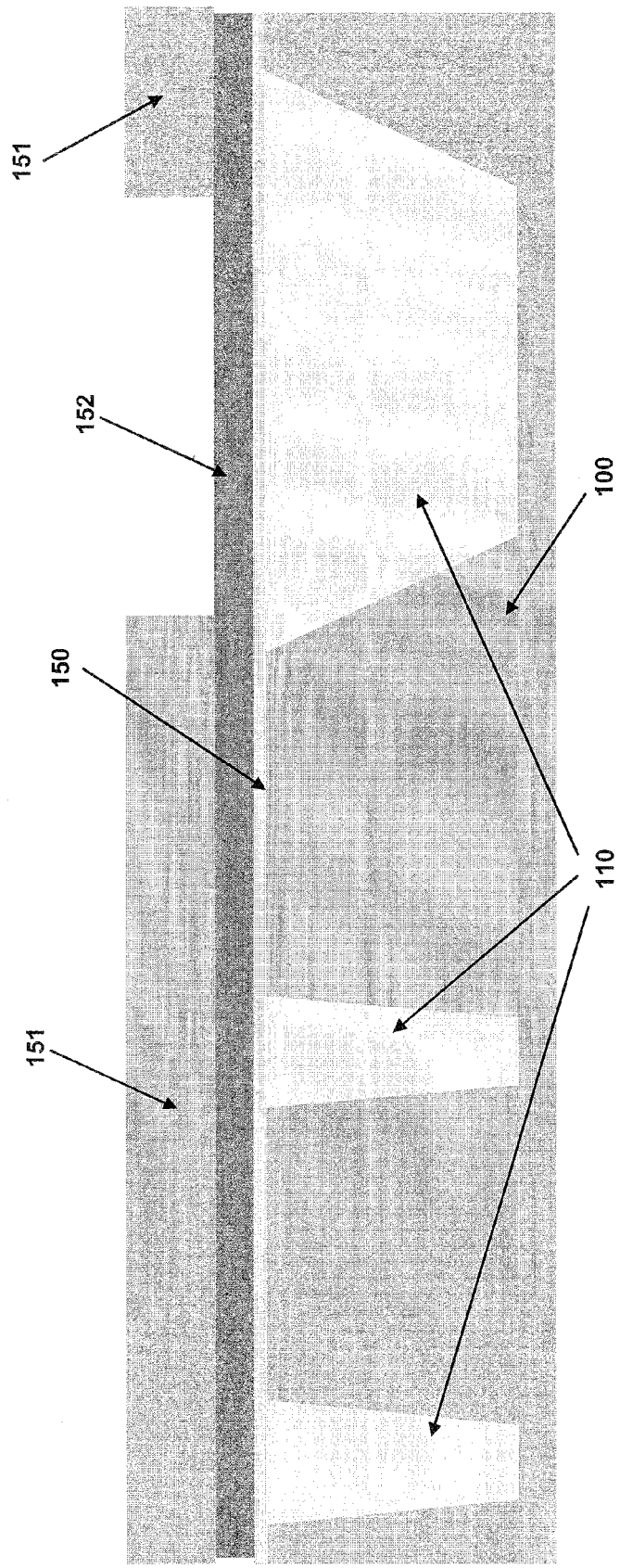
Figure 3:
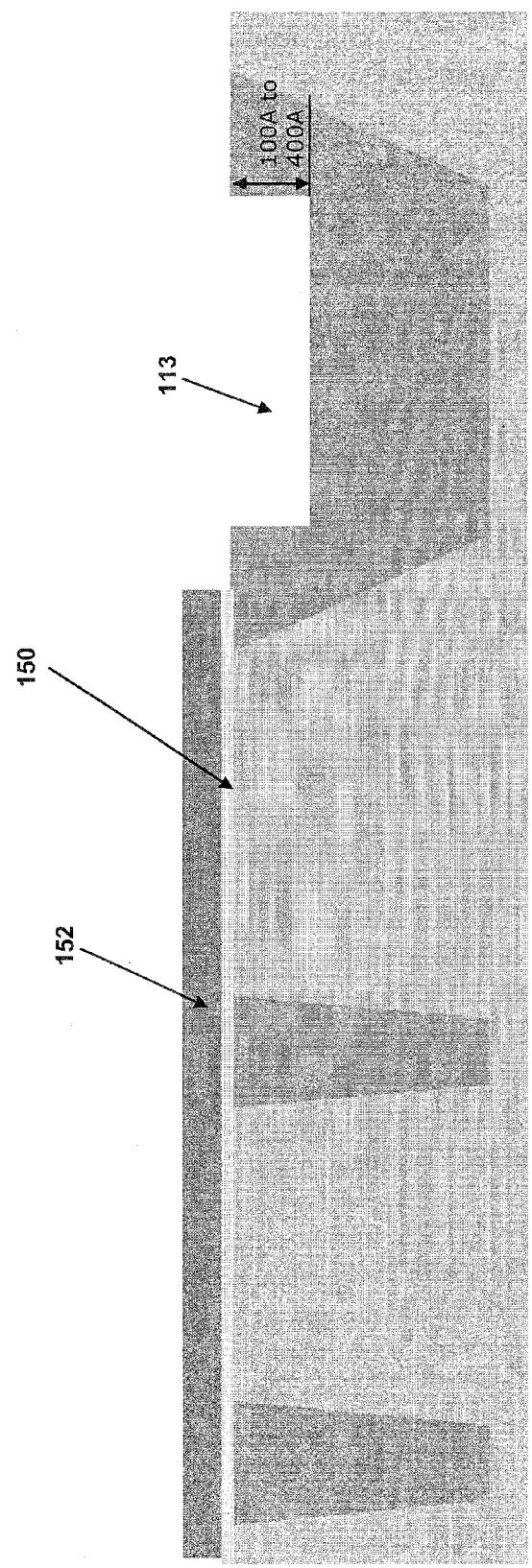

Referring to FIG. 2, photoresist layers 151 are formed on portions of the substrate 100 including the gate oxide layer 150 and the polysilicon layer 152, leaving part of the polysilicon layer 152 and the gate oxide layer 150 on the third STI 110 exposed. Thereafter, referring to FIG. 3, exposed parts of the polysilicon and gate oxide layers 152 and 150, and part of the exposed portion of the third STI 110 are etched to create a recessed portion 113 in the third STI 110, and the photoresist layers 151 are removed. According to an embodiment, the recessed portion 113 is approximately 100 angstroms to approximately 400 angstroms deep. As will be explained in further detail below, having the recessed portion 113 in the third STI 110 sets a resistor stack lower than gate stacks on the substrate 100 so as to protect the resistor stack during a subsequent chemical mechanical polishing (CMP) process.

Figure 4:
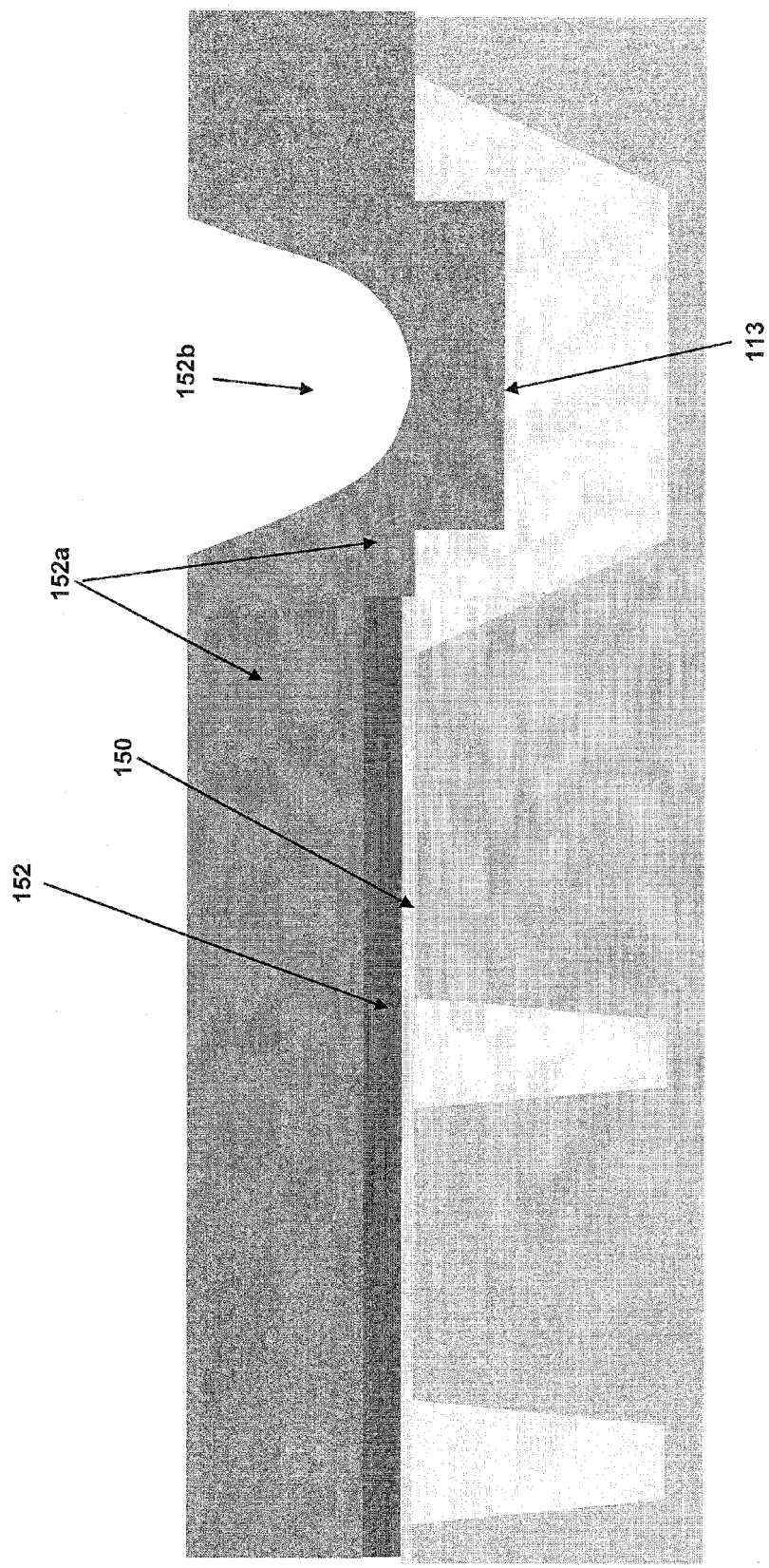

Referring to FIG. 4, another polysilicon layer 152a is formed on the substrate including the first polysilicon layer 152. As a result of having to fill-in the recessed portion 113 and the portions of the substrate 100 where the gate oxide layer 150 and the polysilicon layer 152 were etched away, there is a portion 152b of the polysilicon layer 152a over the recessed portion 113 which is recessed from the rest of the polysilicon layer 152a. According to an embodiment, a thickness of approximately 400 angstroms to approximately 500 angstroms of the polysilicon layer 152a is deposited.

Figure 5:
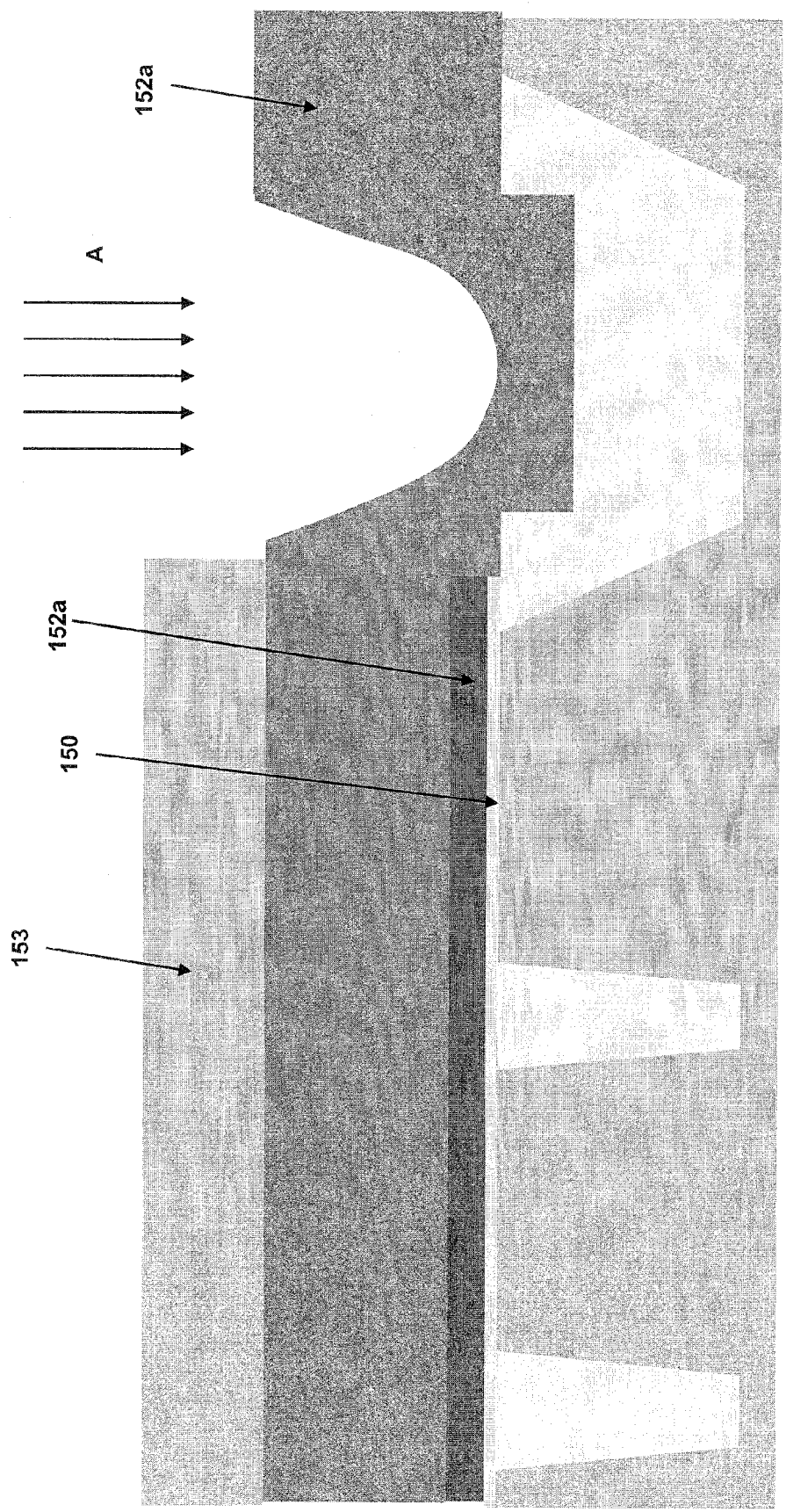

Referring to FIG. 5, as shown by arrows A, a portion of the polysilicon layer 152a not covered by a blocking layer 153, comprising, for example, SiN, is implanted with a P-type ion implant, such as, for example, boron (B). According to an alternative embodiment, the portion of the polysilicon layer 152a may be implanted with an N-type ion implant. After ion implantation, the blocking layer 153 is removed, and a layer of SiN 155 is deposited on the overall structure.

Figure 6:
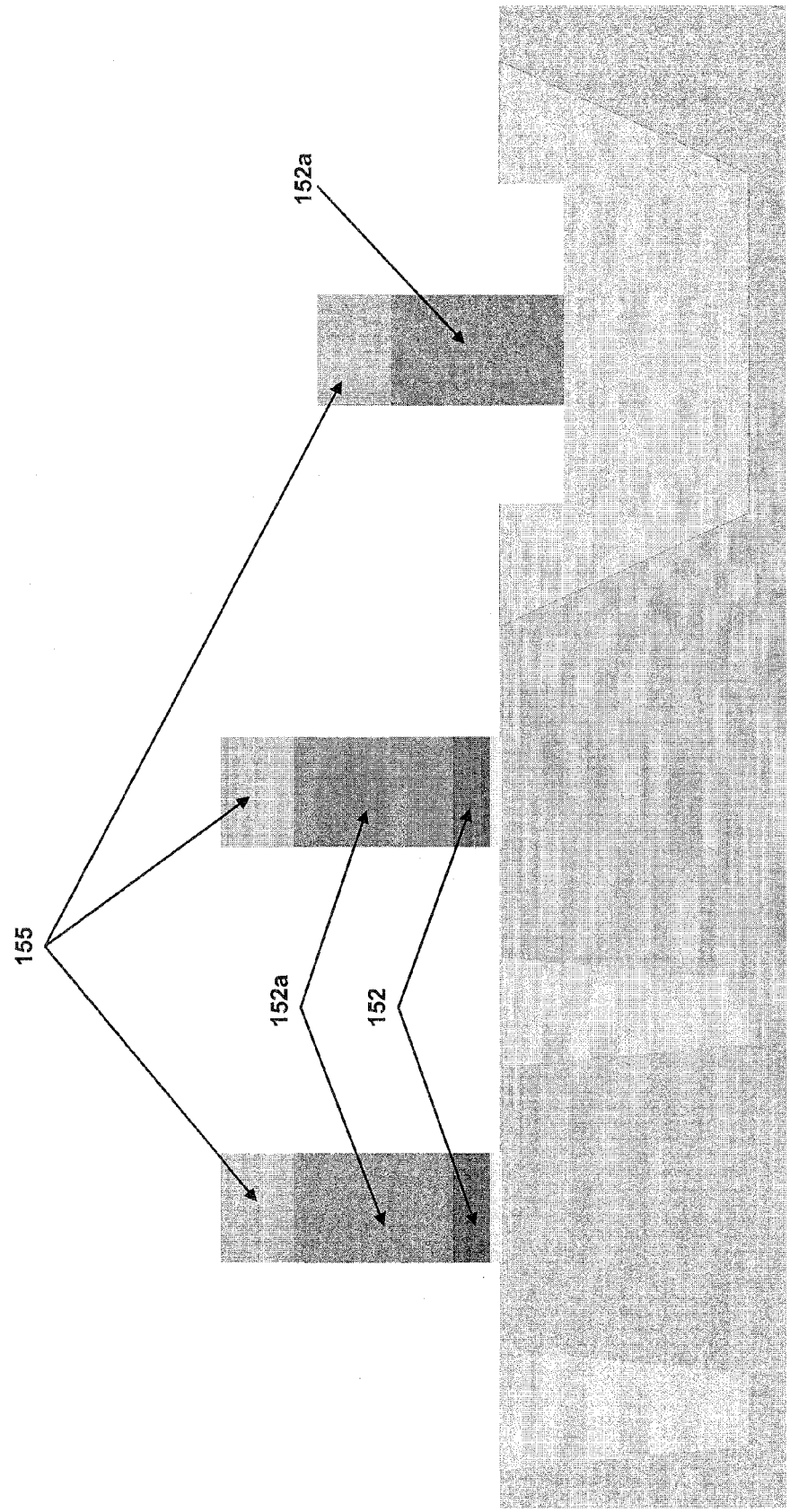

Referring to FIG. 6, areas of the SiN layer 155, the polysilicon layers 152a, 152 and the gate oxide layer 150 not covered by a photoresist are etched to form the resultant structure shown in FIG. 6. According to an embodiment, a reactive ion etching (RIE) process can be used, which removes the unwanted layers using a gaseous chemical process in a radiofrequency field. According to an embodiment, a thickness of the SiN layer 155 is approximately 280 angstroms thick.

Figure 7:
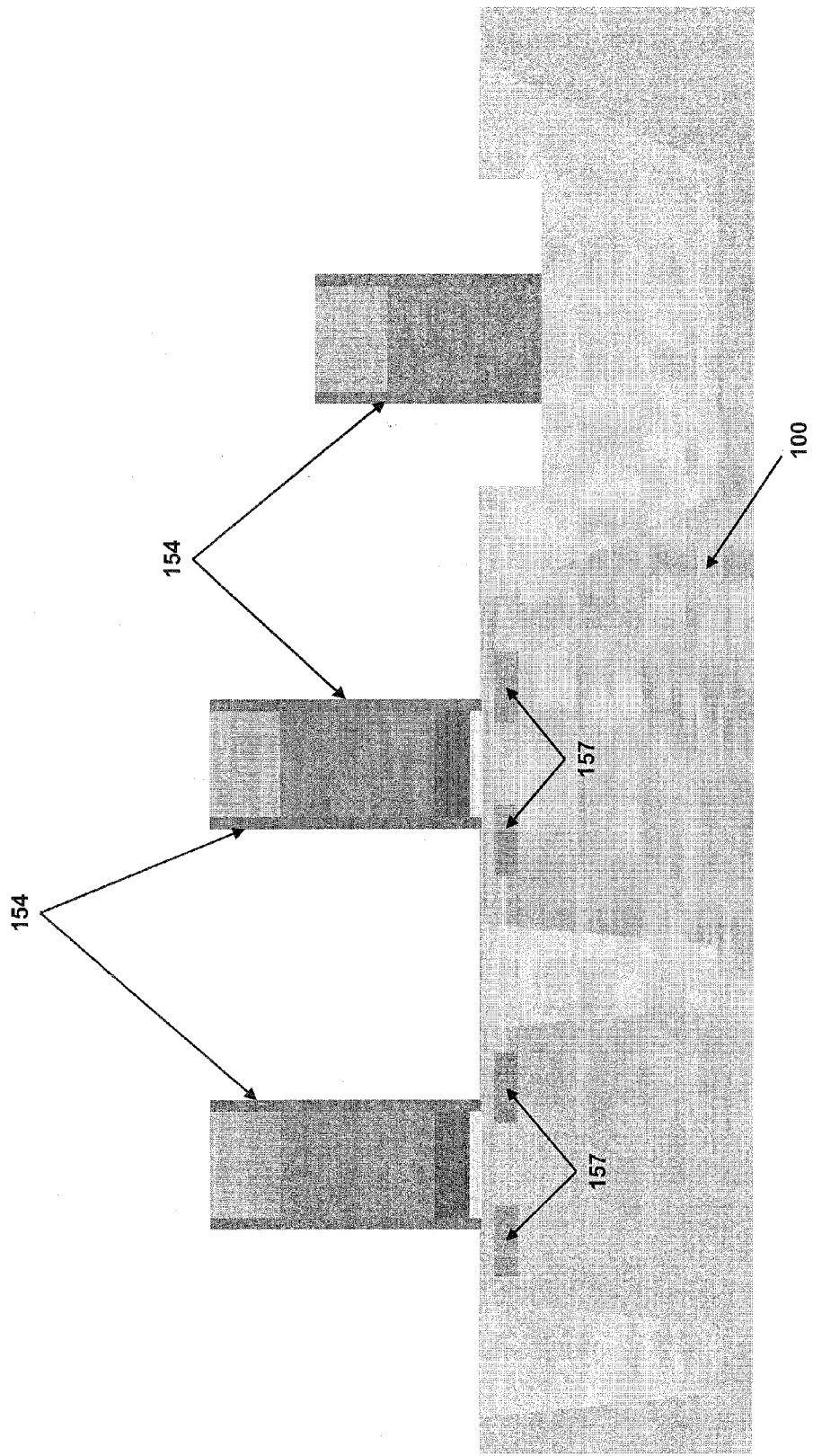

Referring to FIG. 7, spacers 154 are formed on the sidewalls of the structures including the SiN 155 stacked on the polysilicon 152, 152a. In addition, halo implantation is performed to form halo regions 157 in the substrate 100 under source/drain extension regions, and under part of the gate regions.

Figure 8:
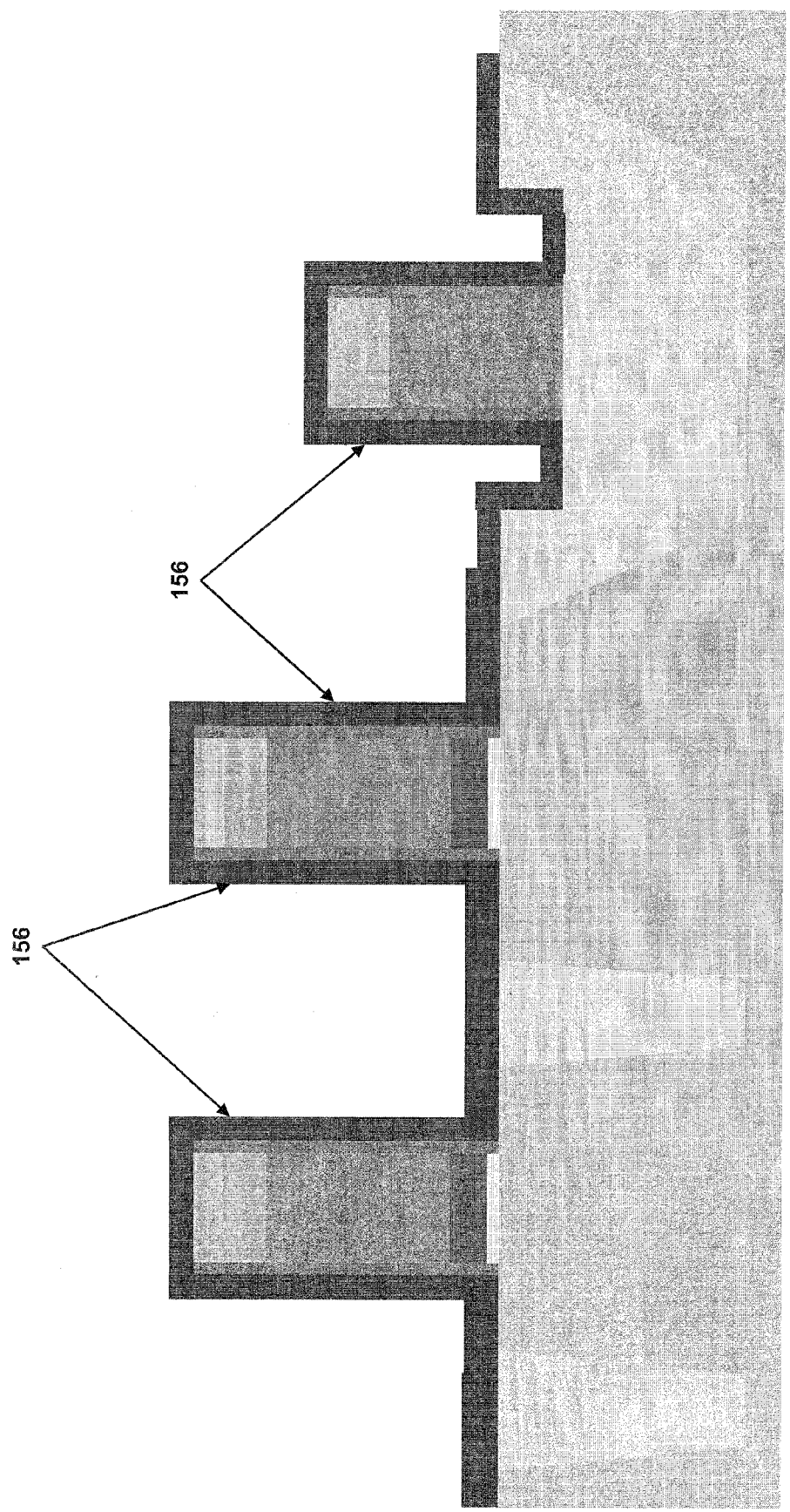

Referring to FIG. 8, a second spacer layer 156 is formed on the stacked structures of SiN and polysilicon including the spacers 154. The number and thickness of the spacer layers 154, 156 can vary depending on design constraints, and is not limited to what is shown. For example, the number of spacer layers can be more or less than 2, and the thickness of the spacer layer(s) can vary. According to an embodiment, SiN can be used as a material for at least one spacer layer.

Figure 9:
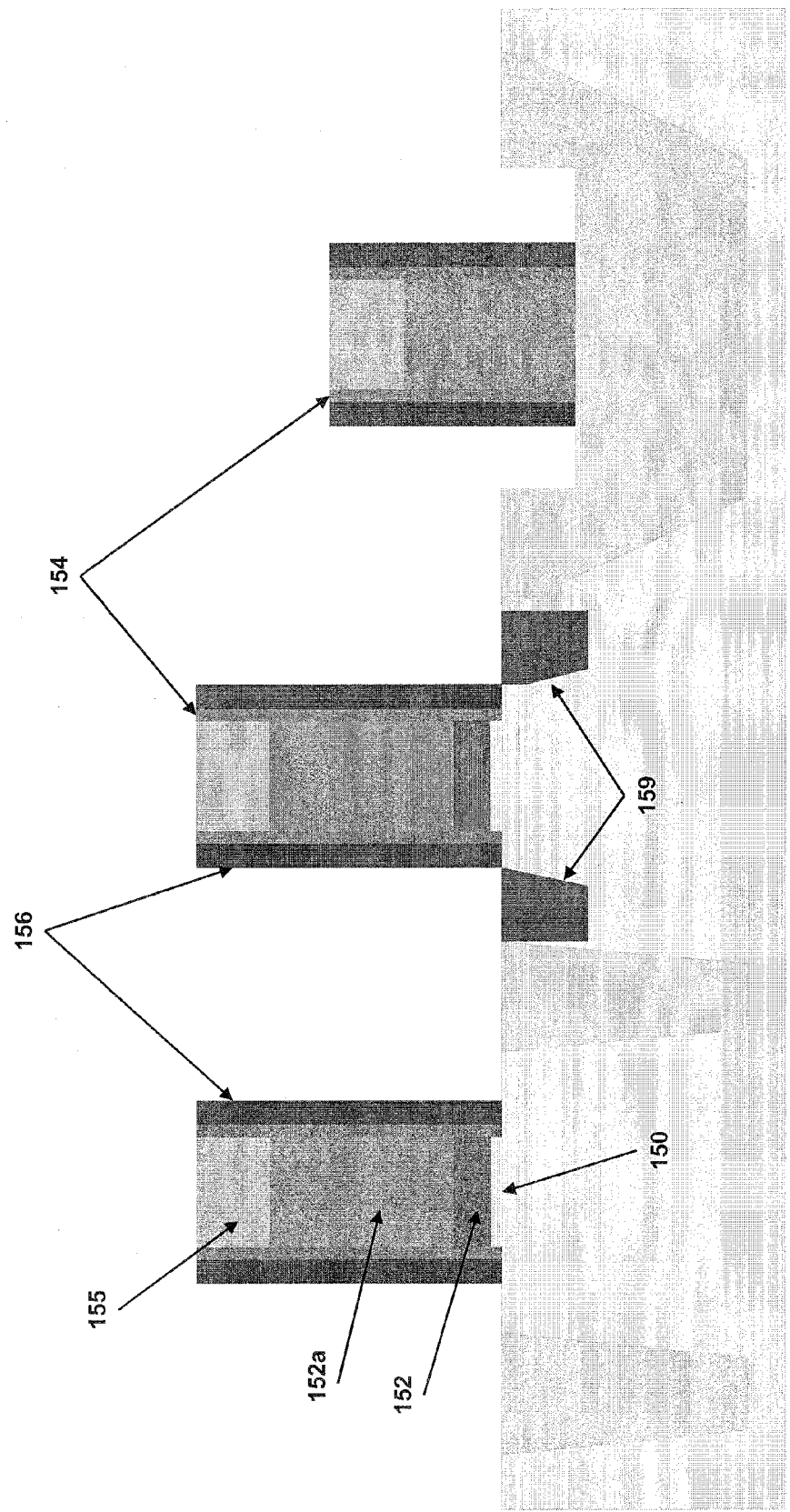

Referring to FIG. 9, an etching process, such as, for example, a light etching process or a wet etching process, is performed to remove portions of the spacer layer 156 from top surfaces of the substrate 100 and the stacked structures, so that the spacer layer 156 remains only sidewalls of the stacked structures. Also, portions of the gate oxide layer 150 remaining under the removed portions of the spacer layer 156, if any, can also be removed during the etching process.

In addition, as shown in FIG. 9, source/drain regions are formed in the substrate on the sides of stacked structures. For example, according to an embodiment, embedded silicon germanium (eSiGe) S/D regions 159 are formed adjacent a stacked structure that will form an SG PFET to improve performance.

Figure 10:
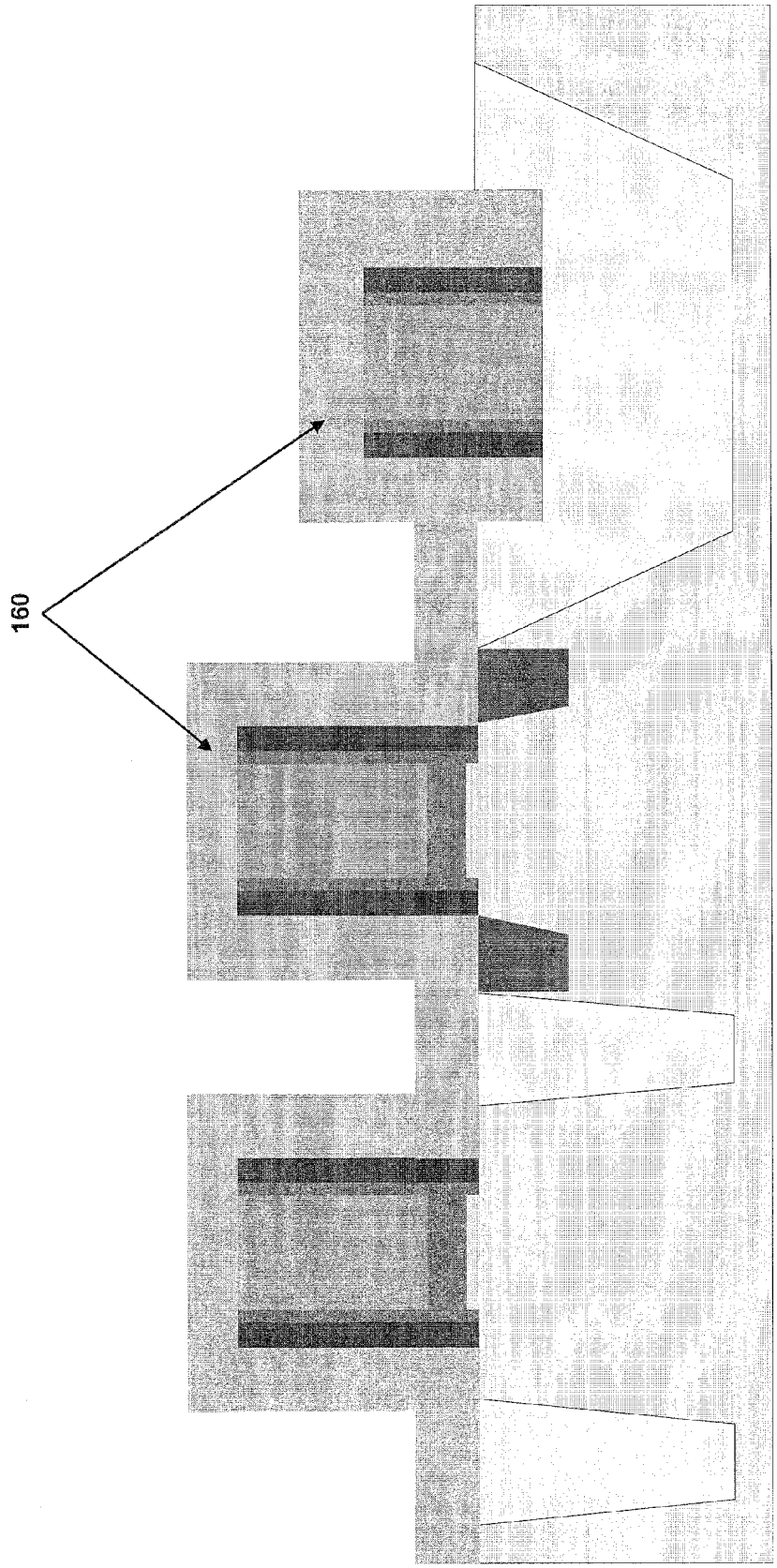

Referring to FIG. 10, the SiN layers 155, which are partially reduced during the formation of the eSiGe S/D regions 159, are completely removed during a subsequent etch process, such as a wet etch process. Thereafter, a stress liner 160 is deposited on the resultant structure, using, for example, chemical vapor deposition (CVD), atomic layer deposition (ALD) or molecular layer deposition (MLD). The stress liner 160 may include, for example, SiN.

Figure 11:
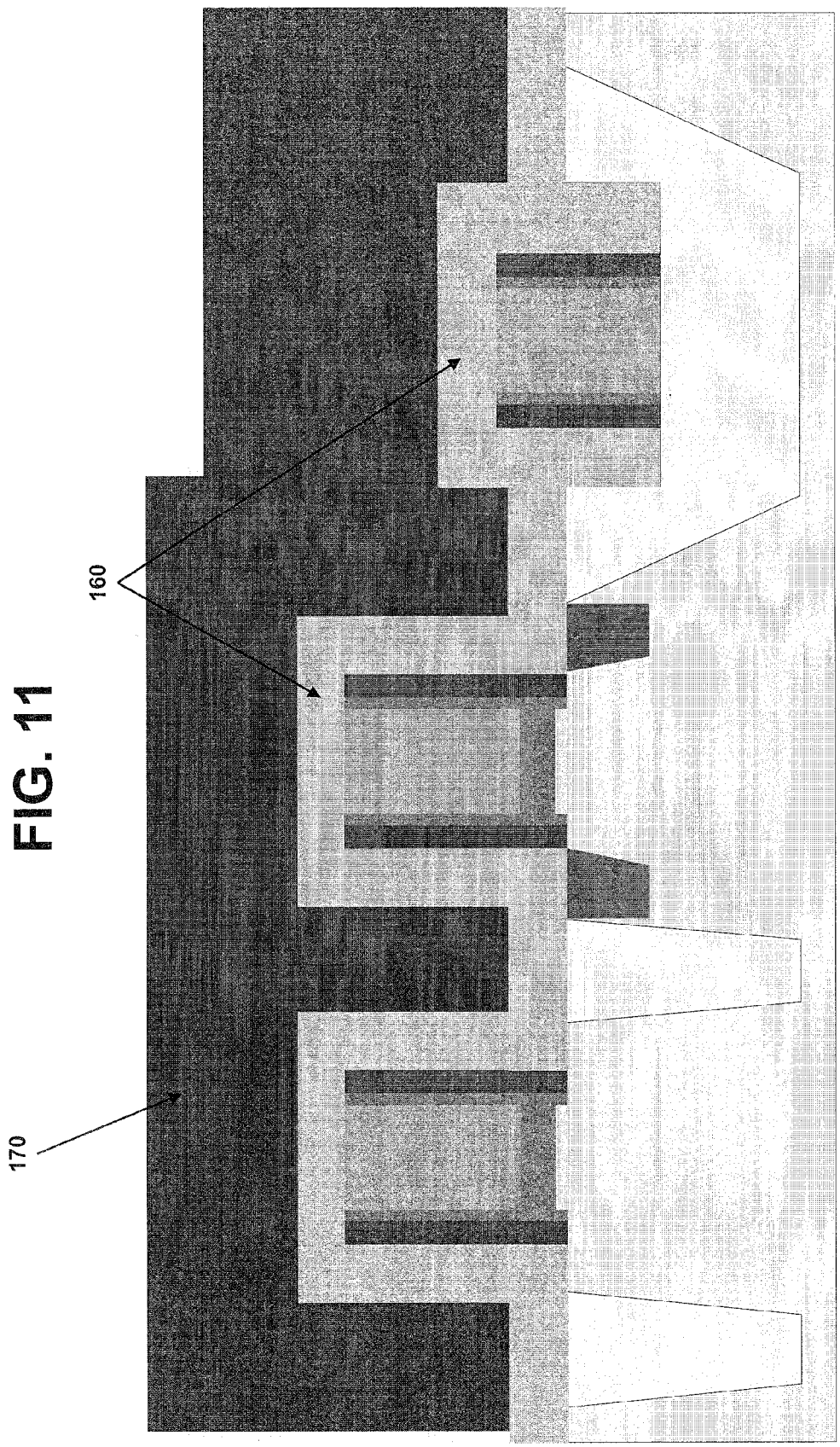

Referring to FIG. 11, a dielectric layer 170 including, for example, undoped silicate glass (USG) or silicon dioxide ($SiO_2$), is deposited on the stress liner 160. Then, referring to FIG. 12, a CMP process is performed on the structure in FIG. 11 to planarize a top surface, resulting in the structure shown in FIG. 12. Since the resistor stack is set lower in the recessed portion 113 than the gate stacks on the substrate 100, the resistor stack is protected from damage during the CMP process.

Figure 12:
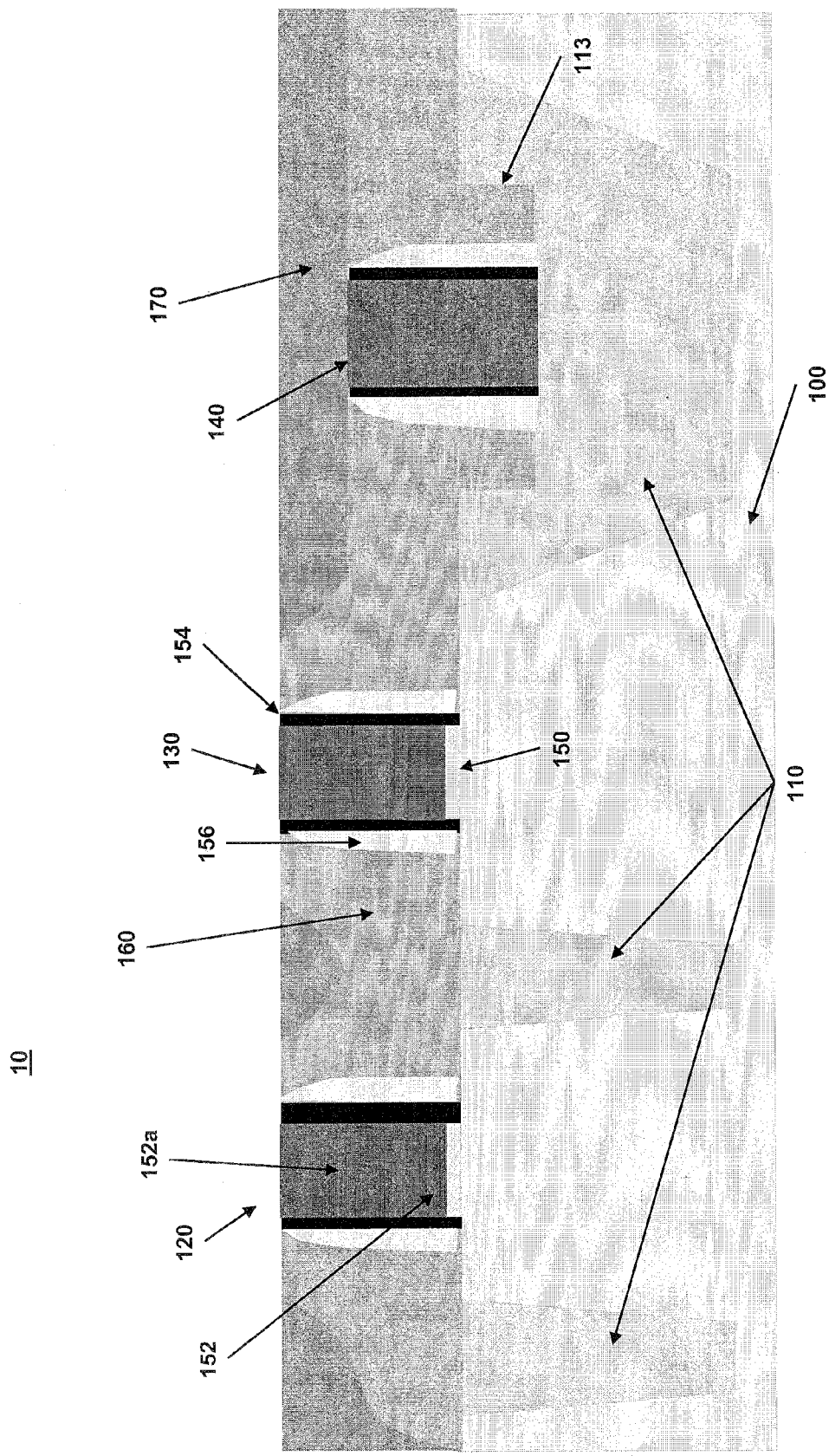

As shown in FIG. 12, on the substrate 100 are formed a first SG FET 120, a second SG FET 130, and a resistor structure 140. According to an embodiment of the present inventive concept, the first SG FET 120 is an NFET, the second SG FET 130 is a PFET, and the resistor structure 140 includes a P+ poly resistor. Alternatively, the doping can be reversed, and the first SG FET 120 can be a PFET, the second SG FET 130 can be an NFET, and the resistor can be an N+ poly resistor. As can be seen, the area of the STI region 110 under the resistor structure 140 is larger than those of the remaining STI regions 110 between and adjacent the FETs.

A combination of the stress liner 160 and the dielectric 170 fill in the areas between and adjacent the FETs 120, 130 and the resistor structure 140. As can be seen in FIG. 12, the FETs 120, 130 each include a gate oxide layer 150, polysilicon layers 152, 152a formed on the gate oxide layer 150, and sidewall spacers 154, 156 formed on the sides of the polysilicon 152, 152a. The resistor structure 140 includes polysilicon 152a and sidewall spacers 154, 156 formed on the sides of the polysilicon 152a.

Figure 13:
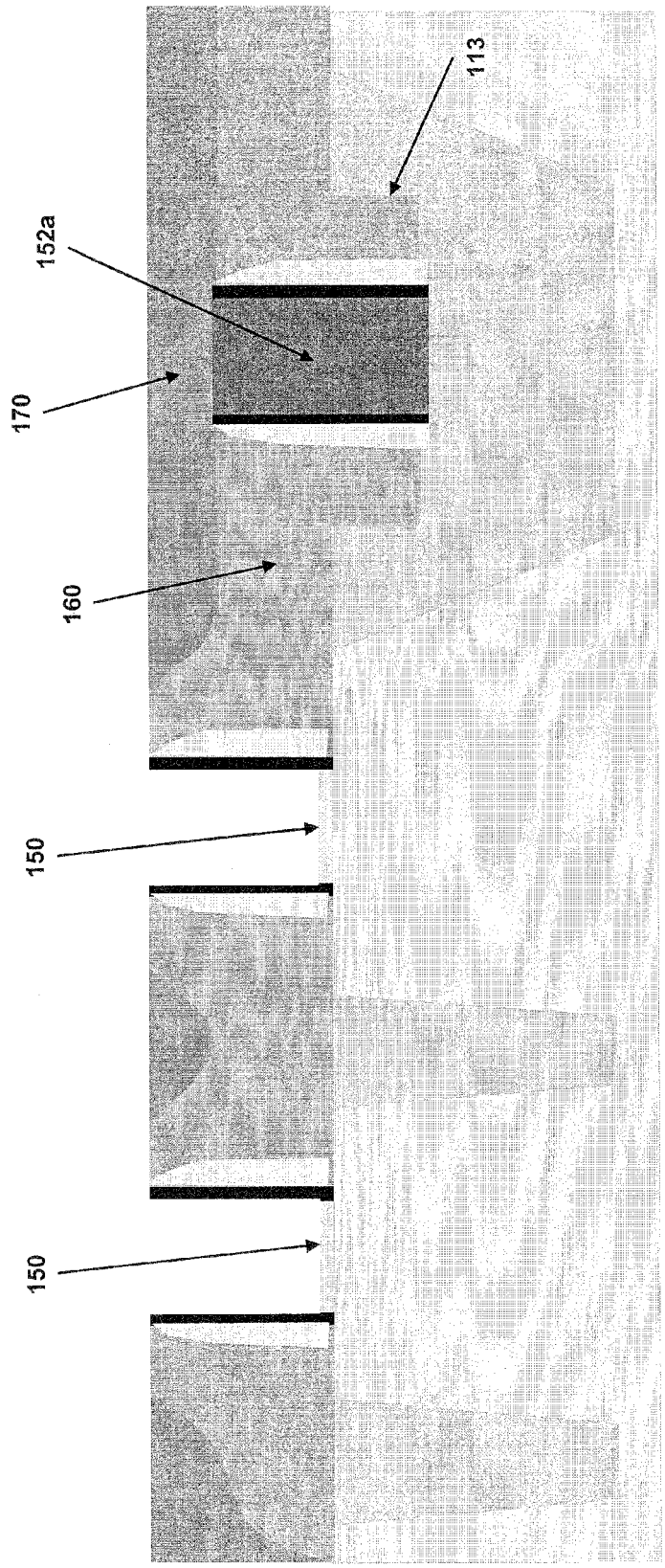

Referring to FIG. 13, the polysilicon 152, 152a is removed from the FETs 120, 130 using, for example, an etching process such as, for example, a wet etch process using, for example, ammonia, tetramethyl ammonium hydroxide (TMAH), and/or tetraethylammonium hydroxide (TEAH). Since the resistor structure 140 remains buried under the dielectric 170 and/or a combination of the dielectric 170 and the stress liner 160, the polysilicon 152, 152a can be fully removed from the FETs 120, 130 in one step down to the gate oxide layers 150 without affecting the resistor structure 140.

In contrast, if the resistor structure 140 was not recessed in the recessed portion 113 and not covered by the dielectric 170 and/or a combination of the dielectric 170 and the stress liner 160, i.e., on the same level as the FETs 120, 130, prior to a process for removing the polysilicon, a photoresist would need to be formed over an area of the substrate 100 including the resistor structure 140 so as to prevent removal of the polysilicon from the area that will form the resistor. After placement of the photoresist, an etching process could be performed to remove the polysilicon 152 from the FETs 120 and 130. In the situation where the resistor structure 140 is not recessed, polysilicon removal from the FETs 120, 130 might be performed in more than one step, wherein an upper portion of the polysilicon material is removed from the FETs 120, 130 using, for example, a light stream wet etch process, an ashing process, using, for example, $H_2N_2$, is used to remove a remaining portion of the polysilicon from the FETs 120, 130.

Figure 14:
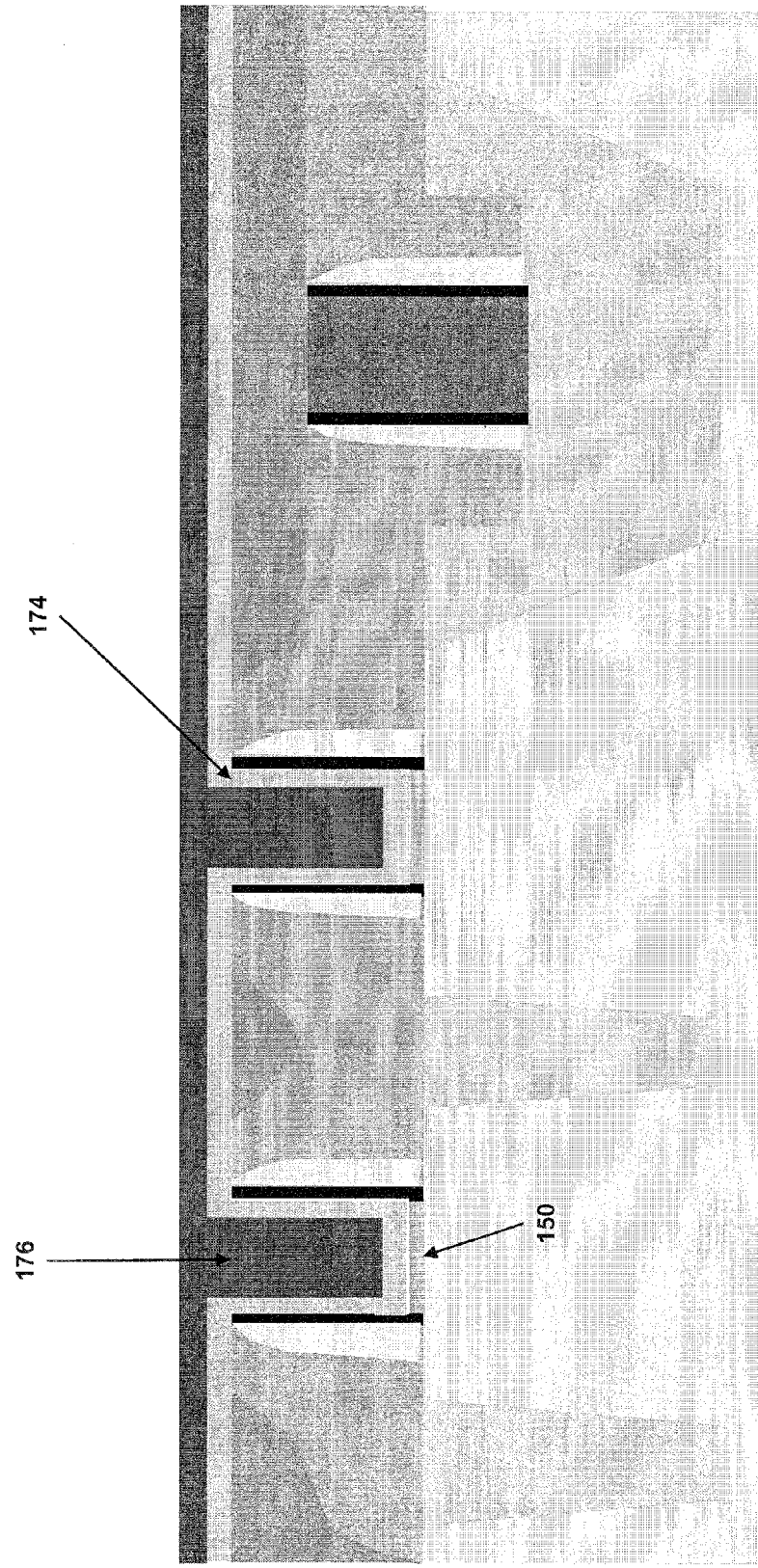

Referring to FIG. 14, a high-K dielectric material 174 having a high dielectric constant κ when compared with that of silicon dioxide such as, for example, hafnium silicate, zirconium silicate, hafnium dioxide and/or zirconium dioxide, is deposited on the structure shown in FIG. 13 using, for example, chemical vapor deposition, atomic layer deposition or molecular layer deposition. After deposition of the high-K dielectric 174, a first metal 176, comprising, for example, a three-layer structure of a bottom layer of TiN, a middle layer of TaN and a top layer of TiN, is deposited on the high-K layer 174. The first metal 176 is not limited to this structure, and may include different materials in different layer configurations.

Figure 15:
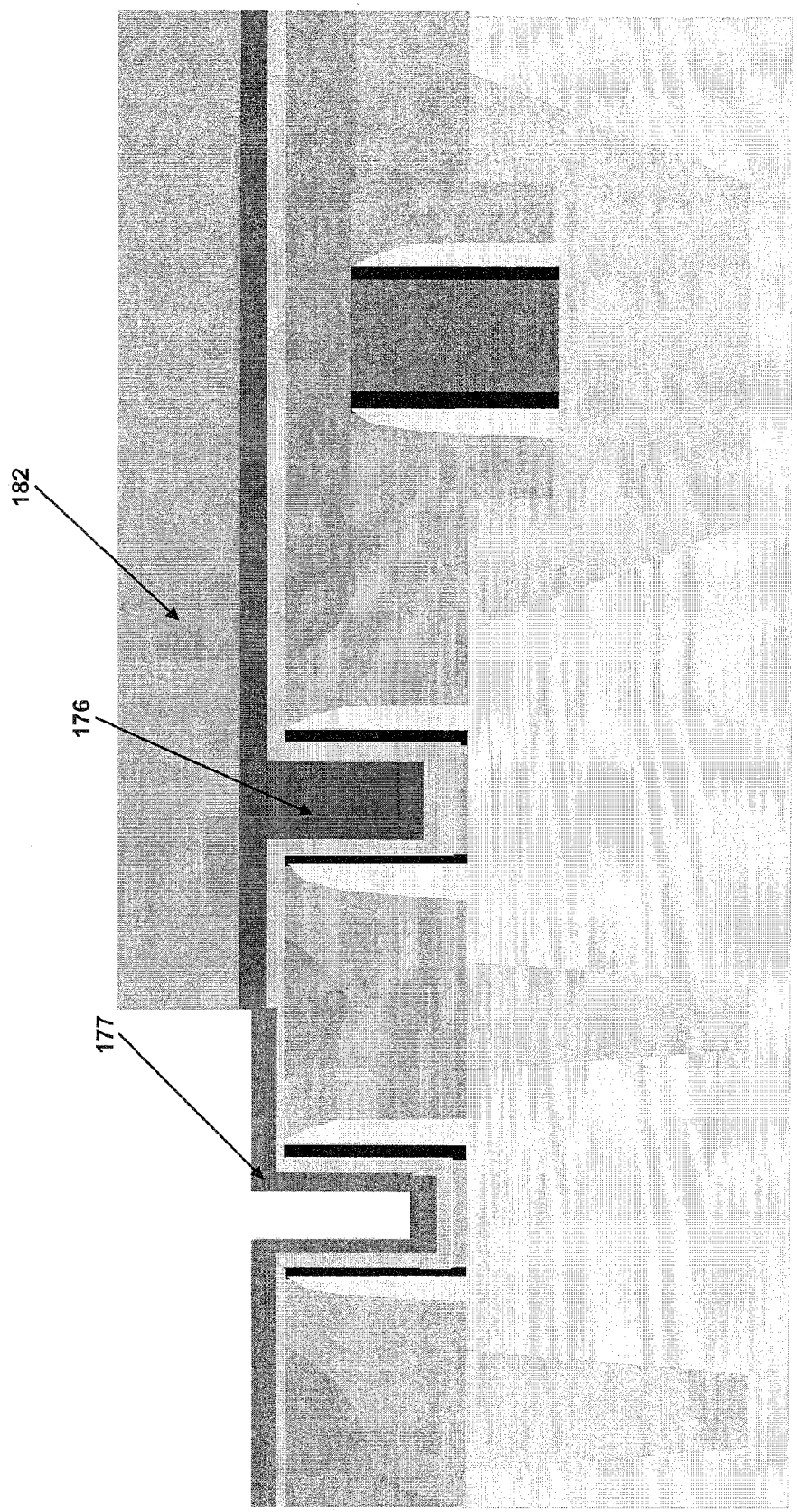

Referring to FIG. 15, in connection with an embodiment where the first metal 176 includes the above-referenced three-layer structure, the top TiN layer is removed from the SG NFET 120, and areas adjacent thereto to result in a two-layer structure 177 including a bottom layer of TiN and a top layer of TaN. A photoresist 182 made of, for example, an oxide or nitride, is used to cover the SG PFET 130, the resistor structure 140, and areas adjacent thereto so that the top TiN layer is not removed from the covered areas. Thereafter, referring to FIG. 16, after the photoresist 182 is removed, a second metal 178 including, for example, a three-layer structure of a bottom layer of TiAl, a middle layer of TiN, and a top layer of titanium and aluminum alloy (Ti/Al), is deposited on the remaining structure. As a result, according to an embodiment, the metal gate 121 (see FIG. 17) for the SG NFET 120 includes a 5-layer structure (from bottom to top) of: TiN—TaN—TiAl—TiN—Ti/Al, and the metal gate 131 (see FIG. 17) for the SG PFET 130 includes a 6-layer structure (from bottom to top) of: TiN—TaN—TiN—TiAl—TiN—Ti/Al. According to alternative embodiments, the metal gates may include different materials in different layer configurations.

Figure 16:
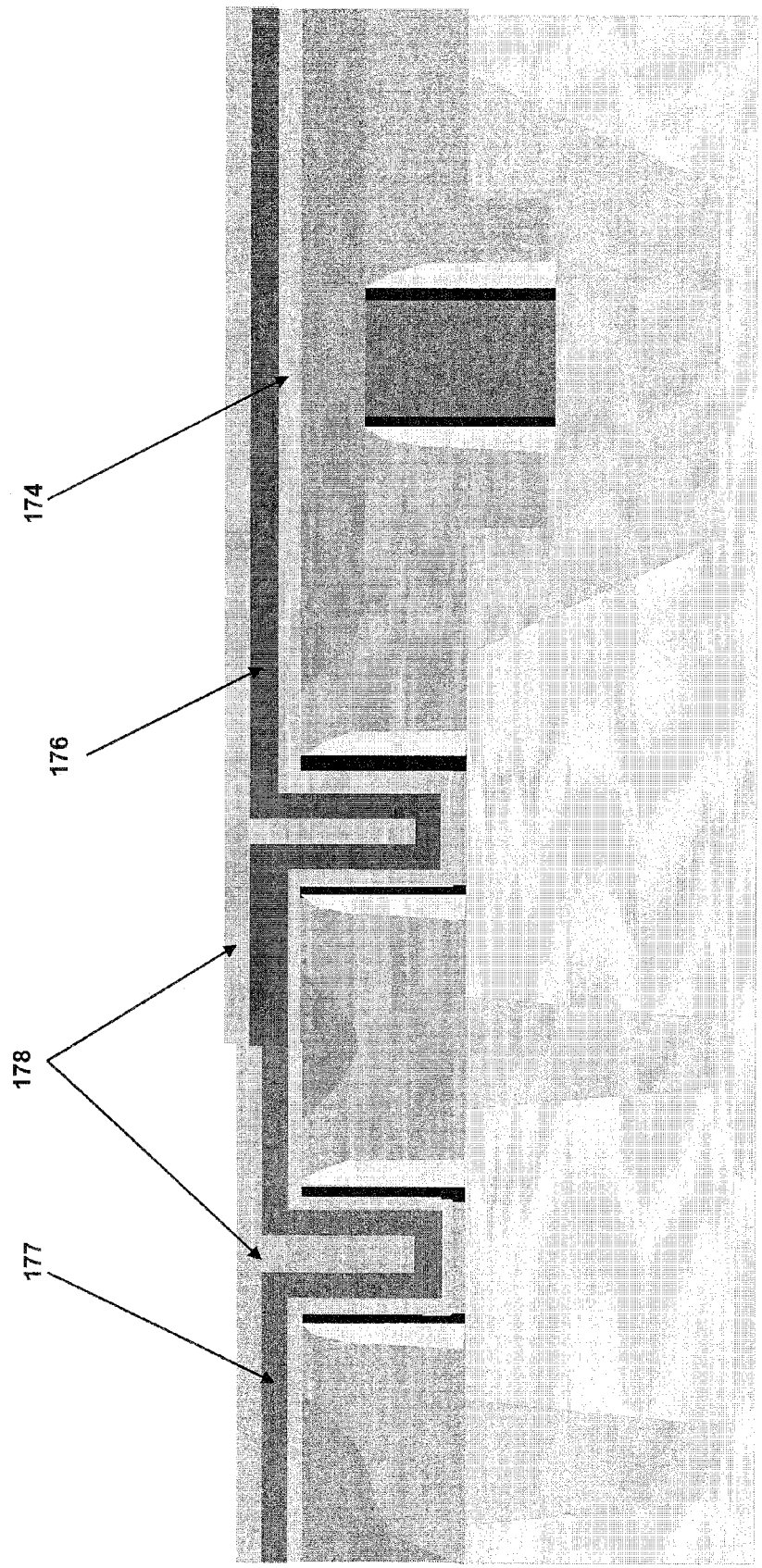
Figure 17:
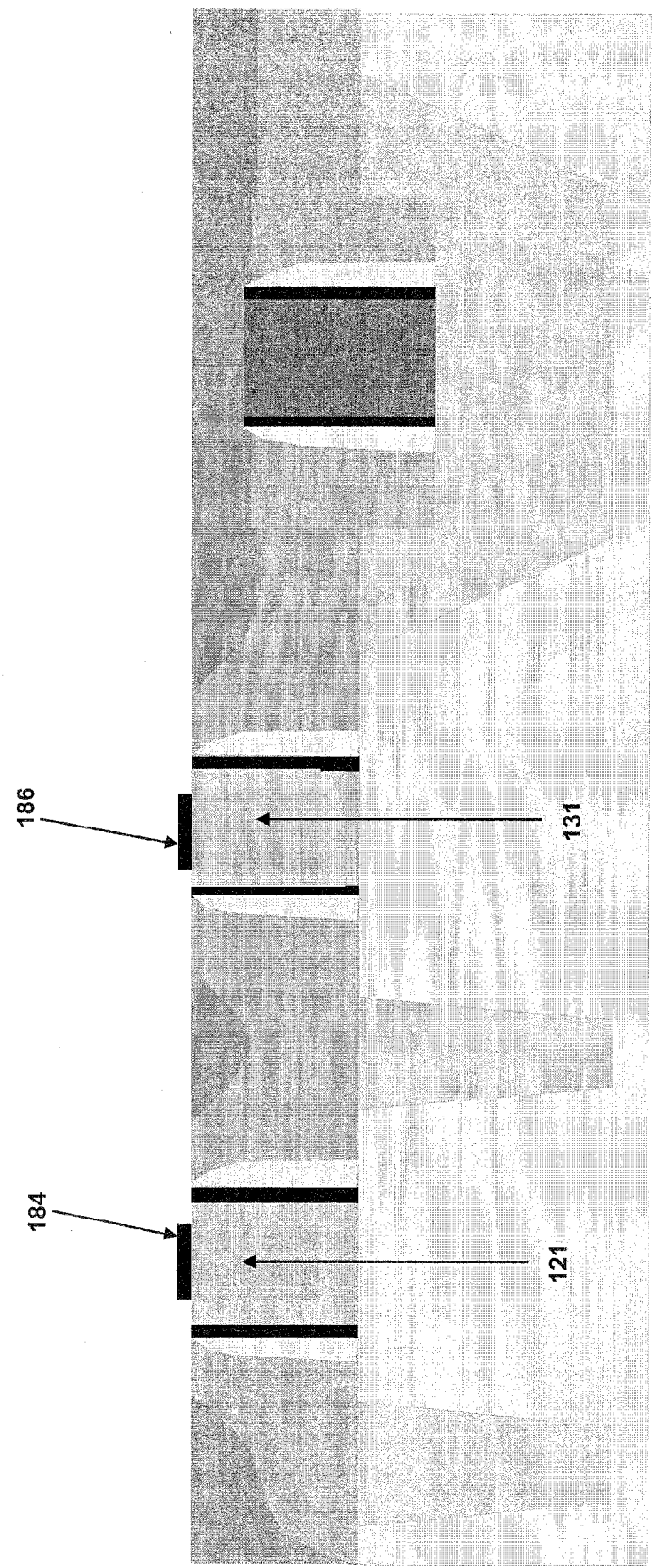

Referring now to FIG. 17, aluminum chemical mechanical polishing (Al CMP) is performed on the structure in FIG. 16. The Al CMP process is performed with a slurry to remove the high-K, and first and second metal layers 174, 176, 178 from a top surface of the substrate, and to planarize the top surface. As a result of the Al CMP process, the structure shown in FIG. 17 is formed, wherein the height of the FETs 120 and 130 is reduced. As can be seen, the recessed resistor structure 140, which is covered by the dielectric 170 and/or a combination of the dielectric 170 and the stress liner 160, is protected from CMP, and remains untouched. Oxidation during the CMP process results in metal oxides 184 and 186 being formed on top of the metal gates 121, 131 of each of the FETs 120 and 130. According to an embodiment, a thickness of the metal oxides 184, 186 is about 20 Å to about 30 Å.

Figure 18:
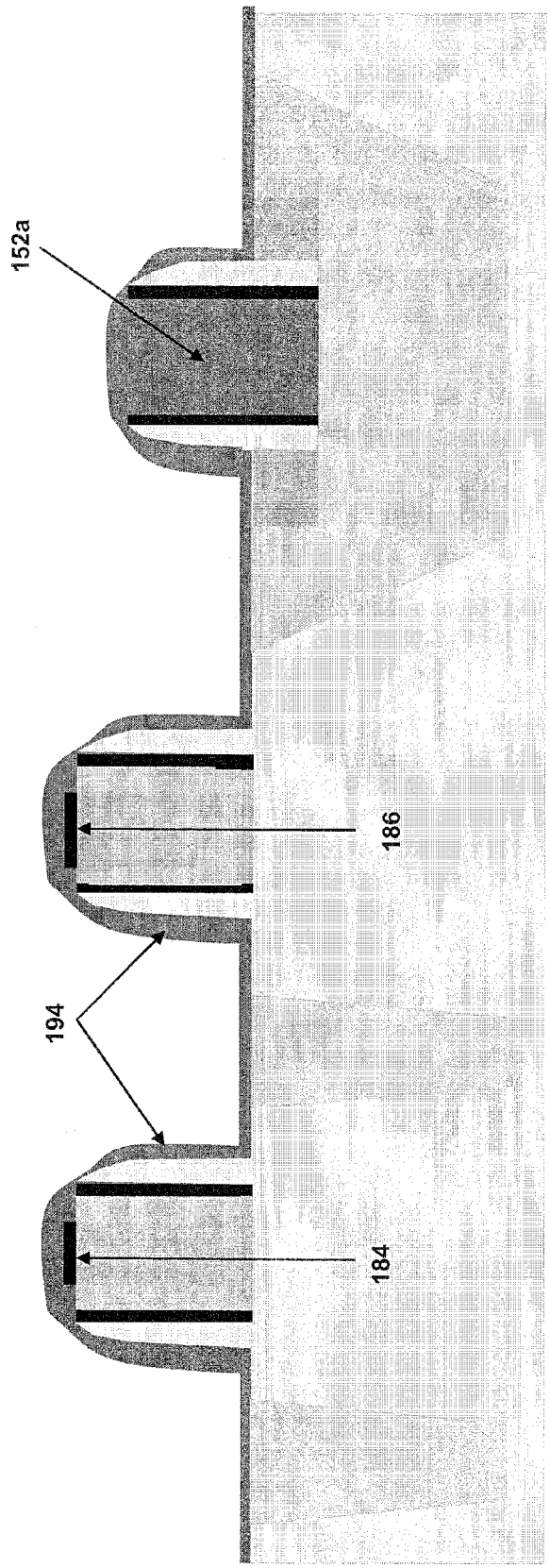

Referring to FIG. 18, the stress liner 160 and dielectric 170 are removed from an upper surface of the substrate 100 by an etching process, such as, for example, a wet etch process. As can be seen a portion of the stress liner 160 and/or dielectric layer 170 remains in the recessed portion 113. Then a second high-K dielectric layer 194 is deposited on the substrate 100 including the FETs 120, 130 and the resistor structure 140 to protect the resistor and the gates. The second high-K dielectric layer 194 may include, for example, hafnium silicate, zirconium silicate, hafnium dioxide and/or zirconium dioxide, and is deposited using, for example, chemical vapor deposition, atomic layer deposition or molecular layer deposition. Then, referring to FIG. 19, a layer of silicon nitride (SiN) or silicon dioxide ($SiO_2$) 196 is deposited on the structure shown in FIG. 18 to result in the structure shown in FIG. 19. The layer 196 is deposited using, for example, chemical vapor deposition, atomic layer deposition or molecular layer deposition.

Figure 20:
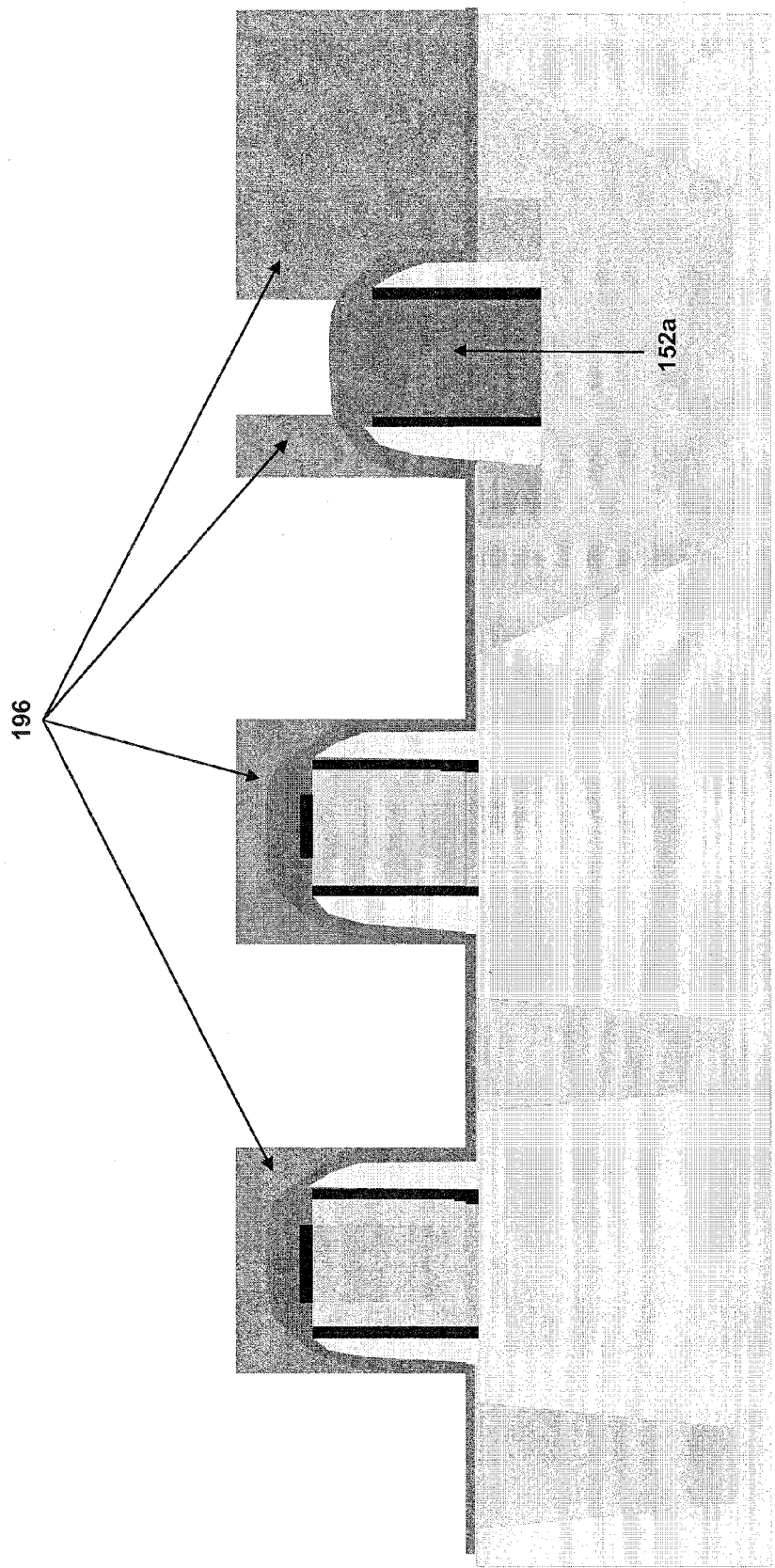

Referring to FIG. 20, using an open mask process, the layer 196 is removed from the areas between the gate and resistor stacks, and over the polysilicon 152*a* forming the resistor, as shown. The areas where the layer 196 is not removed are masked during the removal process. The removal of the layer 196 may be performed using, for example, a light or chemical etching process.

Figure 19:
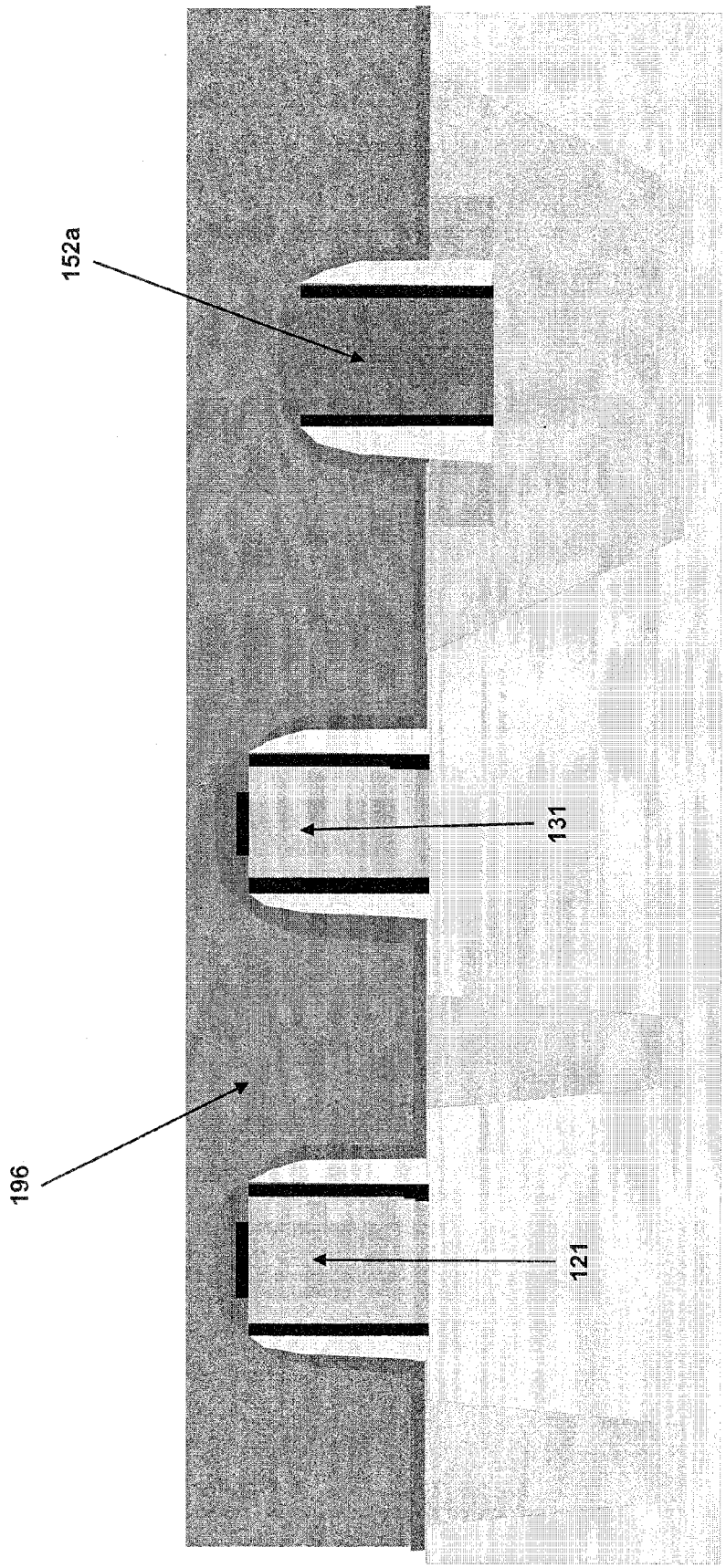

According to an alternative embodiment, instead of depositing the second high-K dielectric layer 194 on the substrate 100, and depositing the layer 196 as shown in FIGS. 18 and 19, a layer of silicon nitride (SiN) or silicon dioxide ($SiO_2$) is deposited on the structure shown in FIG. 17 to result in a structure that is similar to that shown in FIG. 19, but does not include the second high-K dielectric layer 194. Then, using an open mask process, the SiN or $SiO_2$ layer is removed from the areas between the gate and resistor stacks, and over the polysilicon 152*a* forming the resistor, to result in a structure similar to that shown in FIG. 20, without the second high-K dielectric layer 194.

Figure 21:
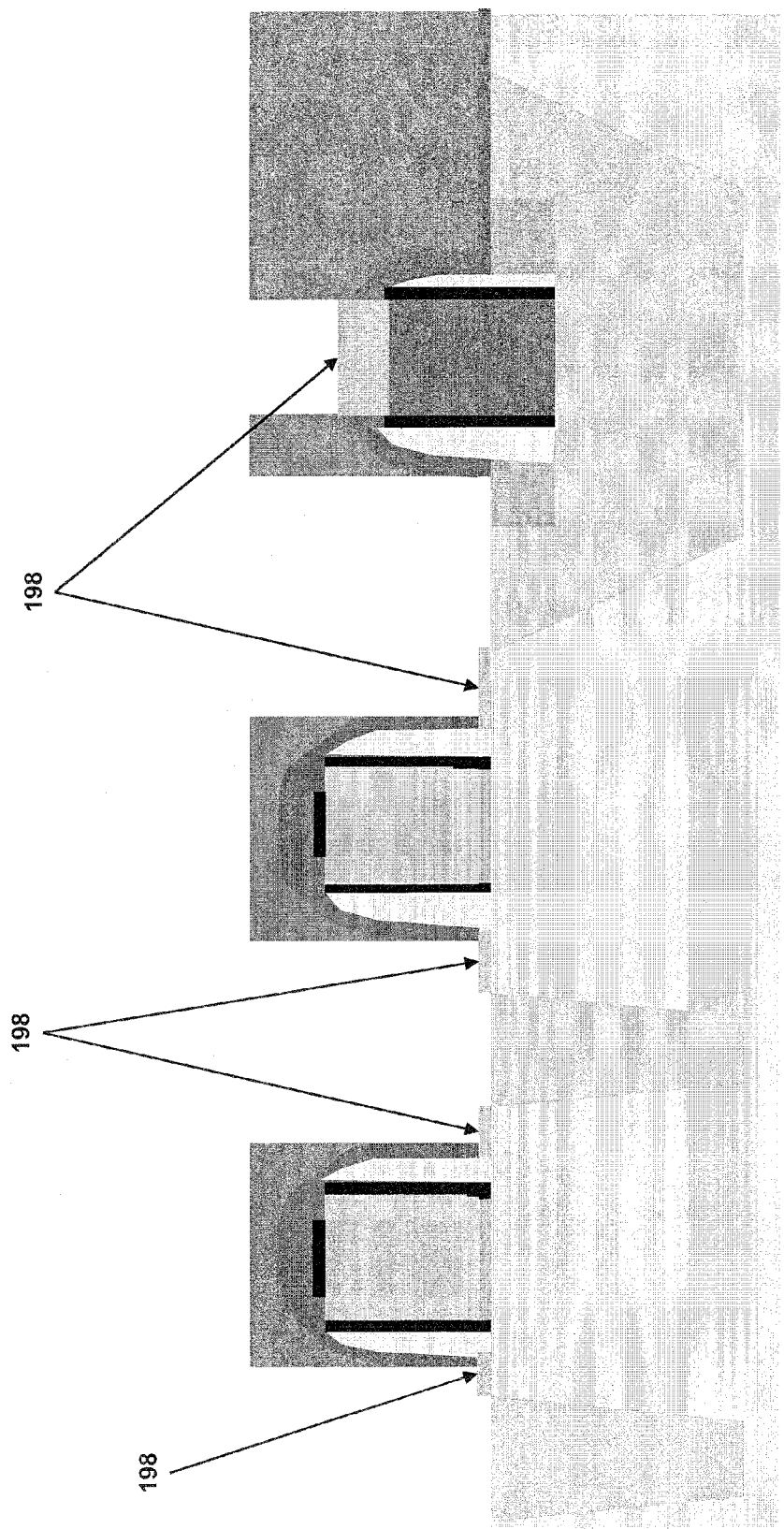

Referring to FIG. 21, silicide is formed on the structure shown in FIG. 20, or on the similar structure formed in the alternative embodiment described above. The silicide can be, for example, nickel silicide (NiSi), but is not limited thereto. Other silicides, such as, for example, sodium silicide ($Na_2Si$), magnesium silicide ($Mg_2Si$), platinum silicide (PtSi), titanium silicide ($TiSi_2$), and tungsten silicide ($WSi_2$), can be used. For purposes of explanation, NiSi is described in connection with the instant embodiment. According to an embodiment, prior to depositing nickel (Ni) on the substrate, the substrate is pre-cleaned to remove oxides, such as the oxides forming the second high-K dielectric layer 194, from those portions of the substrate where the silicide is to be formed, for example, between the gate and resistor stacks. After pre-cleaning, Ni is deposited to react with the silicon in the designated areas, and form the silicide 198. After Ni deposition, annealing is performed, then unreacted Ni is removed, and annealing is again performed. The silicide 198 reduces sheet resistance.

Figure 22:
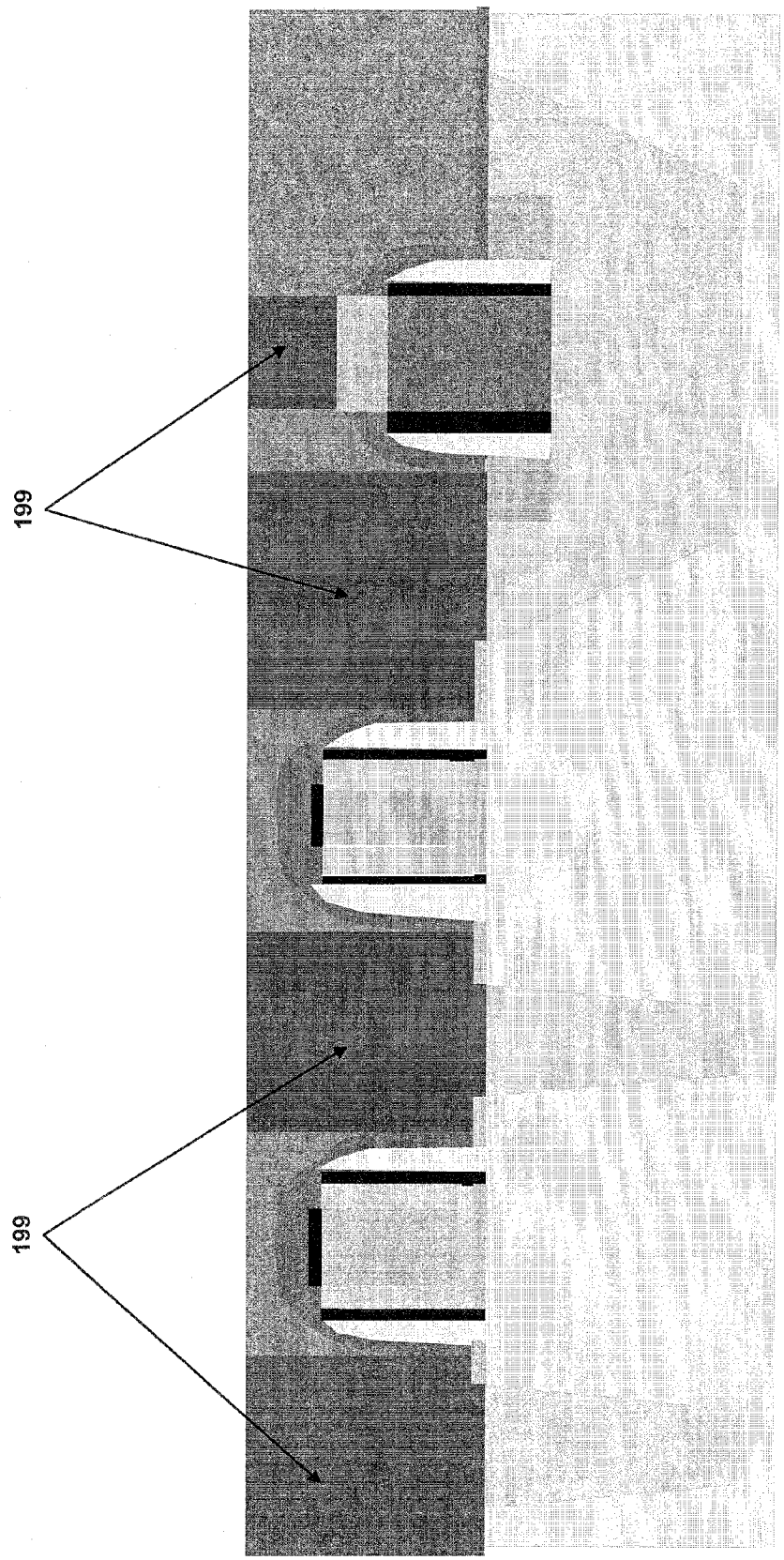

According to an embodiment, referring to FIG. 22, after silicide formation, a layer of silicon nitride (SiN) or silicon dioxide ($SiO_2$) 199 can be deposited on the structure shown in FIG. 21, and thereafter CMP can be performed to result in the structure shown in FIG. 22. The SiN or $SiO_2$ can be deposited using, for example, chemical vapor deposition, atomic layer deposition or molecular layer deposition.

Figure 23:
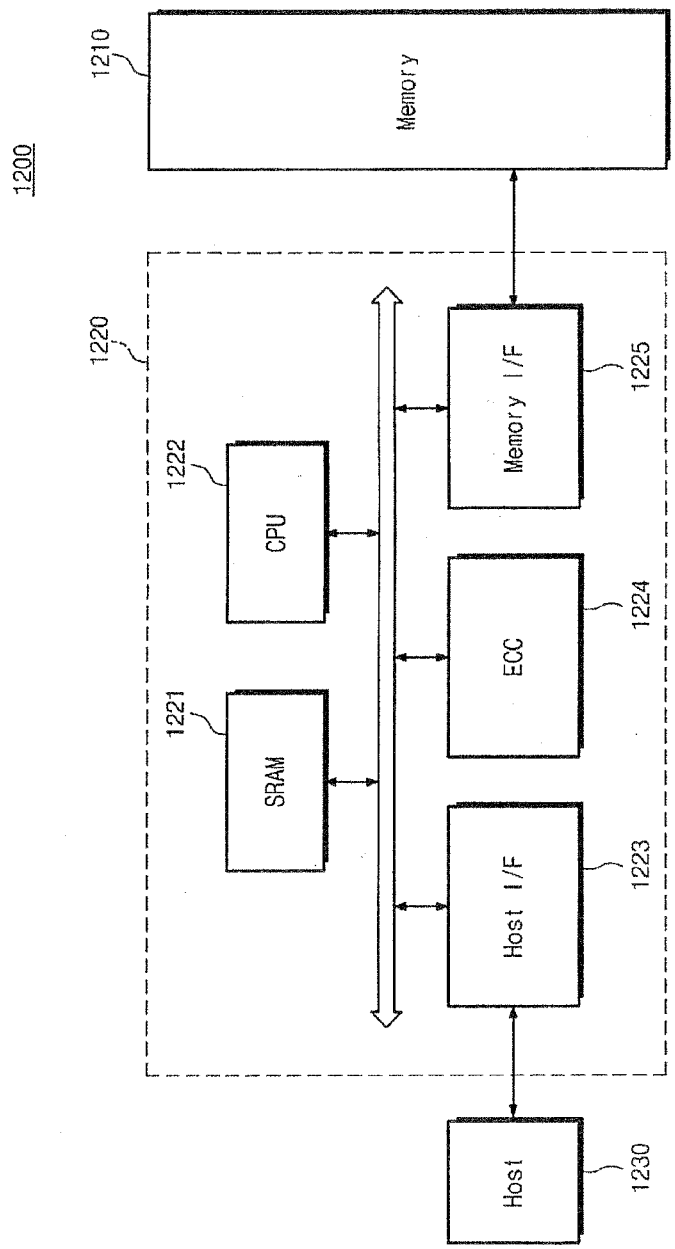
FIG. 23 is a block diagram of a memory card having a semiconductor device according to an embodiment of the present inventive concept.

FIG. 23 is a block diagram of a memory card having a semiconductor device according to an embodiment of the inventive concept.

Referring to FIG. 23, a semiconductor memory 1210 including semiconductor devices according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 24:
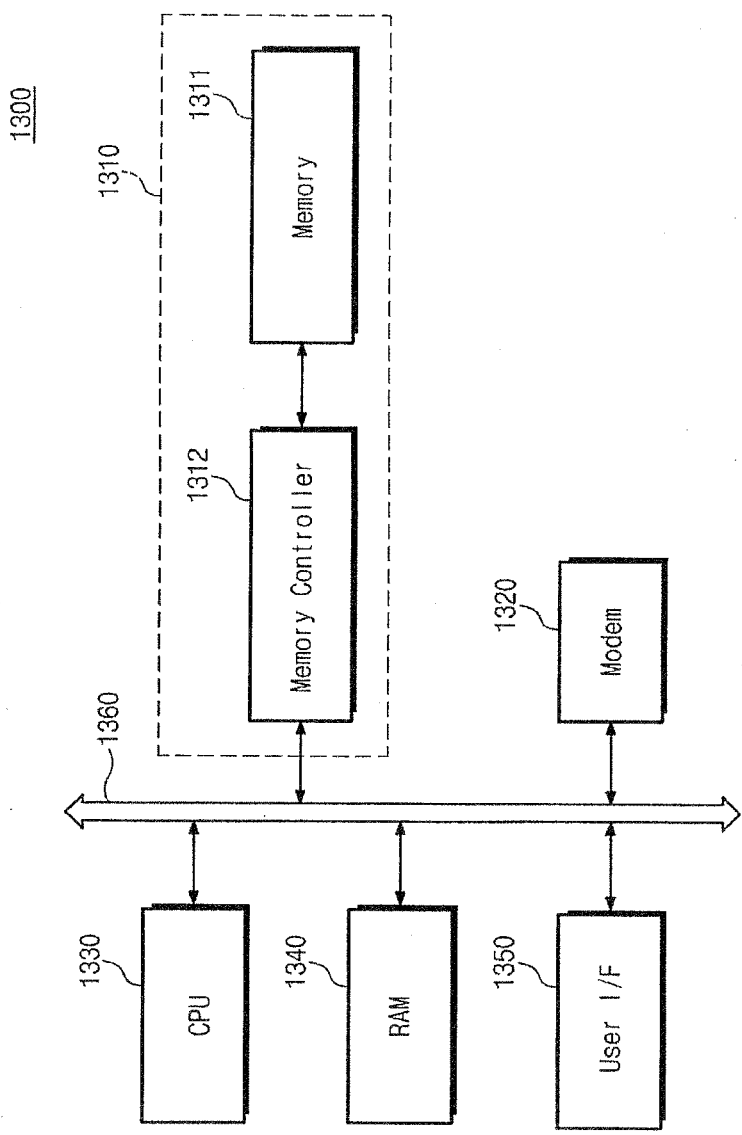
FIG. 24 is a block diagram of an information processing system using a semiconductor device according to an embodiment of the present inventive concept.

FIG. 24 is a block diagram of an information processing system using a semiconductor device according to an embodiment of the inventive concept.

Referring to FIG. 24, an information processing system 1300 may include a memory system 1310 having a semiconductor device according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 23. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Figure 25:
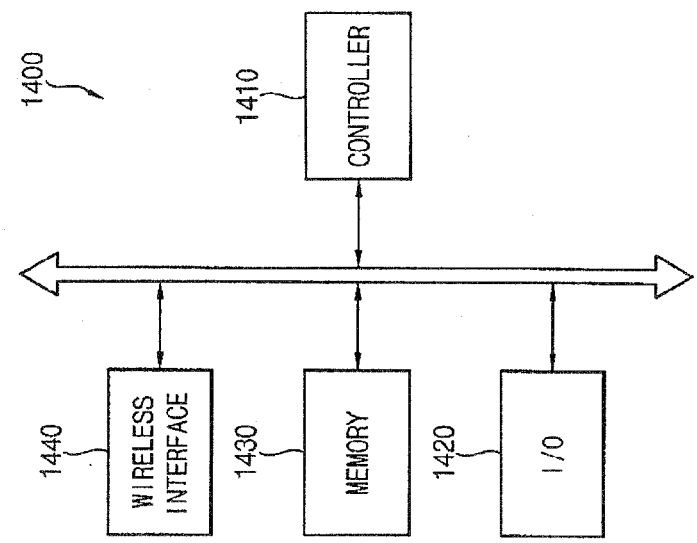
FIG. 25 is a block diagram of an electronic device including a semiconductor device according to exemplary embodiments of the present inventive concept.

Referring to FIG. 25, an electronic device including a semiconductor device according to exemplary embodiments of the present inventive concept will be described. The electronic device 1400 may be used in a wireless communication device (e.g., a personal digital assistant, a laptop computer, a portable computer, a web tablet, a wireless telephone, a mobile phone and/or a wireless digital music player) or in any device capable of transmitting and/or receiving information via wireless environments.

The electronic device 1400 includes a controller 1410, an input/output (I/O) device 1420 (e.g., a keypad, a keyboard, and a display), a memory 1430 having a semiconductor device according to at least one embodiment of the present inventive concept, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device according to at least one embodiment of the present inventive concept. The electronic device 1400 may utilize the wireless interface 1440 to transmit/receive data via a wireless communication network. For example, the wireless interface 1440 may include an antenna and/or a wireless transceiver. The electronic device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Although exemplary embodiments of the present inventive concept have been described hereinabove, it should be understood that the present inventive concept is not limited to these embodiments, but may be modified by those skilled in the art without departing from the spirit and scope of the present inventive concept.

What is claimed is:

1. A method for manufacturing a semiconductor device, comprising:
   forming a first gate stack portion on a surface of a substrate, the first gate stack portion including a first gate oxide layer and a first polysilicon layer on the first gate oxide layer;
   forming a second gate stack portion on the surface of the substrate, the second gate stack portion including a second gate oxide layer and a second polysilicon layer on the second gate oxide layer;
   forming a resistor portion in a recessed portion of the substrate below the surface of the substrate, the resistor portion including a third polysilicon layer; and
   removing the first and second polysilicon layers from the first and second gate stack portions to expose the first and second gate oxide layers, wherein at least one of a dielectric layer and a stress liner cover a top surface of the resistor portion during removal of the first and second polysilicon layers.

2. The method for manufacturing the semiconductor device according to claim 1, wherein removing the first and second polysilicon layers comprises etching using at least one of ammonia, tetramethyl ammonium hydroxide (TMAH), and tetraethylammonium hydroxide (TEAH).

3. The method for manufacturing the semiconductor device according to claim 1, wherein the recessed portion is formed by etching a portion of an isolation region formed below the surface of the substrate.

4. The method for manufacturing the semiconductor device according to claim 1, further comprising:
   depositing a high-K dielectric material on exposed portions of the substrate, including the first and second gate oxide layers; and
   depositing a first metal on the high-K dielectric layer.

5. The method for manufacturing the semiconductor device according to claim 1, wherein removing the first and second polysilicon layers is performed in a single step.

6. A computer system comprising a semiconductor device having a circuit layout manufactured by the method of claim 1, wherein the computer system is one of a personal computer (PC), a personal digital assistant (PDA), an MP3 player, a digital audio recorder, a pen-shaped computer, a digital camera, or a video recorder.

7. A semiconductor memory card, comprising:
   an interface part that interfaces with an external device;
   a controller that communicates with the interface part and a memory device via address and data buses, wherein the memory device comprises a circuit layout manufactured by the method of claim 1.

8. The method for manufacturing the semiconductor device according to claim 3, wherein the recessed portion has a depth of about 100 angstroms to 400 angstroms below the surface of the substrate.

9. The method for manufacturing the semiconductor device according to claim 3, further comprising:
   depositing, prior to removing the first and second polysilicon layers from the first and second gate stack portions, the at least one of the dielectric layer and the stress liner on the substrate adjacent and between the first and second gate stack portions and the resistor portion, and over the resistor portion; and
   performing a chemical mechanical polishing to remove part of the at least one of the dielectric layer and the stress liner to planarize a top surface of the semiconductor device to be level with a top of the first and second gate stack portions, leaving the at least one of a dielectric layer and a stress liner covering the top surface of the resistor portion.

10. The method for manufacturing the semiconductor device according to claim 9, further comprising:
    depositing a high-K dielectric material on exposed portions of the substrate, including the first and second gate oxide layers; and
    depositing a metal on the high-K dielectric layer.

11. The method for manufacturing the semiconductor device according to claim 10, further comprising:
    performing a chemical mechanical polishing to remove the high-K dielectric material, and the metal from a top surface of the semiconductor device, and to planarize the top surface of the semiconductor device; and
    removing the at least one of the dielectric layer and the stress liner from the substrate except for a portion of the at least one of the dielectric layer and the stress liner in the recessed portion.

12. The method for manufacturing the semiconductor device according to claim 4, wherein the first metal comprises a three-layer structure of a bottom layer of TiN, a middle layer of TaN and a top layer of TiN.

13. The method of manufacturing the semiconductor device according to claim 12, further comprising:
   forming a photoresist covering the second gate stack portion and the resistor portion; and
   removing the top layer of TiN from the first gate stack portion.

14. The method for manufacturing the semiconductor device according to claim 13, further comprising:
   removing the photoresist; and
   depositing a second metal on exposed portions of the substrate, including the first and second gate stack portions.

15. The method for manufacturing the semiconductor device according to claim 14, wherein the second metal comprises a three-layer structure of a bottom layer of TiAl, a middle layer of TiN, and a top layer of titanium and aluminum alloy (Ti/Al).

16. The method for manufacturing the semiconductor device according to claim 14, further comprising:
   performing a chemical mechanical polishing to remove the high-K dielectric material, the first metal and the second metal from a top surface of the semiconductor device, and to planarize the top surface of the semiconductor device.

17. A method for manufacturing a semiconductor device, comprising:
   forming a plurality of isolation regions in a substrate;
   depositing a gate oxide layer on a surface of the substrate including the plurality of isolation regions;
   depositing a first polysilicon layer on the gate oxide layer;
   forming a photoresist on part of the polysilicon layer, wherein a portion of the polysilicon layer over an isolation region remains exposed;
   removing the exposed portion of the polysilicon layer, and portions of the gate oxide layer and the isolation region under the exposed portion of the polysilicon layer to form a recessed portion below the surface of the substrate;
   removing the photoresist;
   depositing a second polysilicon layer in the recessed portion and on the substrate including the first polysilicon layer; and
   doping a portion of the second polysilicon layer formed in the recessed portion.

18. The method for manufacturing the semiconductor device according to claim 17, wherein the portion of the second polysilicon layer in the recessed portion is doped with boron.

19. The method for manufacturing the semiconductor device according to claim 17, wherein the recessed portion has a depth of about 100 angstroms to 400 angstroms below the surface of the substrate.

20. The method for manufacturing the semiconductor device according to claim 17, wherein the portion of the second polysilicon layer formed in the recessed portion forms a resistor of the semiconductor device.

21. A system for transmitting or receiving data, the system comprising:
   a memory device for storing a program; and
   a processor in communication with the memory device, wherein the memory device comprises:
   a substrate;
   a first gate stack portion on a surface of the substrate, the first gate stack portion including a first gate oxide layer and a first metal layer on the first gate oxide layer;
   a second gate stack portion on the surface of the substrate, the second gate stack portion including a second gate oxide layer and a second metal layer on the second gate oxide layer; and
   a resistor portion positioned in a recessed portion below the surface of the substrate, the resistor portion including a polysilicon layer, wherein a top surface of the resistor portion is positioned below top surfaces of the first and second gate stack portions.

22. The system according to claim 21, wherein the system comprises at least one of a mobile system, a portable computer, a web tablet, a mobile phone, a digital music player, or a memory card.

23. A semiconductor memory card, comprising:
   an interface part that interfaces with an external device;
   a controller that communicates with the interface part and a memory device via address and data buses, wherein the memory device comprises:
   a substrate;
   a first gate stack portion on a surface of the substrate, the first gate stack portion including a first gate oxide layer and a first metal layer on the first gate oxide layer;
   a second gate stack portion on the surface of the substrate, the second gate stack portion including a second gate oxide layer and a second metal layer on the second gate oxide layer; and a resistor portion positioned in a recessed portion below the surface of the substrate, the resistor portion including a polysilicon layer, wherein a top surface of the resistor portion is positioned below top surfaces of the first and second gate stack portions.

24. A system for transmitting or receiving data, the system comprising:
   a memory device for storing a program; and
   a processor in communication with the memory device, wherein the memory device comprises a circuit layout manufactured by the method of claim 1.

25. The system according to claim 24, wherein the system comprises at least one of a mobile system, a portable computer, a web tablet, a mobile phone, a digital music player, or a memory card.

* * * * *